United States Patent
Kawaguchi et al.

(10) Patent No.: US 9,760,183 B2
(45) Date of Patent: Sep. 12, 2017

(54) DEFORMABLE KEYBOARD WITH ADJUSTABLE LAYOUT

(71) Applicant: Sony Corporation, Tokyo (JP)

(72) Inventors: Hiroto Kawaguchi, Kanagawa (JP); Tetsuro Goto, Tokyo (JP); Toshio Kano, Kanagawa (JP); Hideo Tanaka, Kanagawa (JP); Hayato Hasegawa, Kanagawa (JP); Takashi Itaya, Kanagawa (JP); Takayuki Tanaka, Kanagawa (JP); Fumihiko Iida, Kanagawa (JP); Tomoaki Suzuki, Kanagawa (JP); Taizo Nishimura, Kanagawa (JP); Yuji Takahashi, Kanagawa (JP); Yasushi Itoshiro, Nagano (JP); Shogo Shinkai, Kanagawa (JP)

(73) Assignee: Sony Corporation, Tokyo (JP)

( * ) Notice: Subject to any disclaimer, the term of this patent is extended or adjusted under 35 U.S.C. 154(b) by 143 days.

(21) Appl. No.: 14/759,667

(22) PCT Filed: Dec. 16, 2013

(86) PCT No.: PCT/JP2013/007389
§ 371 (c)(1),
(2) Date: Jul. 8, 2015

(87) PCT Pub. No.: WO2014/115221
PCT Pub. Date: Jul. 31, 2014

(65) Prior Publication Data
US 2015/0346839 A1 Dec. 3, 2015

(30) Foreign Application Priority Data

Jan. 23, 2013 (JP) .................................. 2013-010448
Sep. 11, 2013 (JP) .................................. 2013-188463

(51) Int. Cl.
*G06F 3/02* (2006.01)
*G06F 3/044* (2006.01)
*H03K 17/96* (2006.01)

(52) U.S. Cl.
CPC ............ *G06F 3/0202* (2013.01); *G06F 3/044* (2013.01); *H03K 17/9622* (2013.01); *H03K 2217/96079* (2013.01)

(58) Field of Classification Search
CPC ........ G06F 3/02; G06F 3/0202; G06F 3/0221; G06F 3/044; G06F 3/047; H03K 17/9622; H03K 2217/96079
(Continued)

(56) References Cited

U.S. PATENT DOCUMENTS 4,268,815 A 5/1981 Eventoff et al.
8,913,031 B2 12/2014 Honda et al.
(Continued)

FOREIGN PATENT DOCUMENTS

JP 59-119621 A 7/1984
JP 61-173333 A 8/1986
(Continued)

*Primary Examiner* — Larry Sternbane
(74) *Attorney, Agent, or Firm* — Wolf, Greenfield & Sacks, P.C.

(57) ABSTRACT

An input apparatus including a deformable sheet-like operational member having a plurality of key areas.

19 Claims, 31 Drawing Sheets

(58) Field of Classification Search
USPC .......................................................... 345/168
See application file for complete search history.

(56) References Cited

U.S. PATENT DOCUMENTS

| | | | |
|---|---|---|---|
| 9,310,200 B2 | 4/2016 | Kabasawa et al. | |
| 2006/0243462 A1 | 11/2006 | Schilling et al. | |
| 2007/0257821 A1 | 11/2007 | Son et al. | |
| 2008/0202251 A1 | 8/2008 | Serban et al. | |
| 2011/0069036 A1 | 3/2011 | Anno | |
| 2011/0162944 A1 | 7/2011 | Liu et al. | |
| 2011/0175845 A1 | 7/2011 | Honda et al. | |
| 2011/0240989 A1 | 10/2011 | Sekine et al. | |
| 2012/0113071 A1 | 5/2012 | Kawaguchi et al. | |
| 2013/0063356 A1* | 3/2013 | Martisauskas .......... G06F 3/016 345/168 | |
| 2013/0076994 A1 | 3/2013 | Kawaura | |
| 2014/0007682 A1 | 1/2014 | Kabasawa et al. | |
| 2015/0270076 A1 | 9/2015 | Katsuhara et al. | |
| 2015/0277626 A1 | 10/2015 | Shinkai et al. | |
| 2015/0280708 A1 | 10/2015 | Goto et al. | |
| 2015/0363023 A1 | 12/2015 | Kawaguchi et al. | |
| 2016/0011691 A1 | 1/2016 | Shinkai et al. | |
| 2016/0026297 A1 | 1/2016 | Shinkai et al. | |
| 2016/0202800 A1 | 7/2016 | Itaya et al. | |
| 2016/0294388 A1 | 10/2016 | Kawaguchi et al. | |

FOREIGN PATENT DOCUMENTS

| | | |
|---|---|---|
| JP | 01-294325 A | 11/1989 |
| JP | 09-179679 A | 7/1997 |
| JP | 11-136116 A | 5/1999 |
| JP | 2012-146267 A | 8/2012 |
| WO | WO 87/04851 A1 | 8/1987 |

* cited by examiner

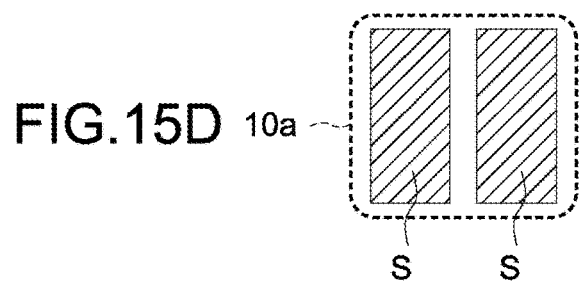
FIG.15D
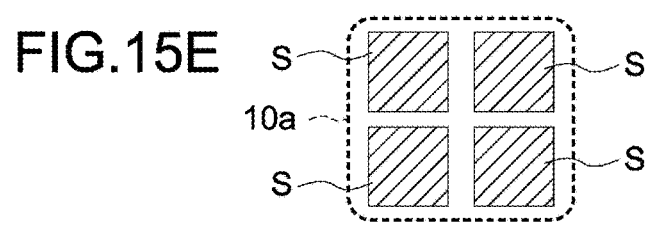
FIG.15E
FIG.15F
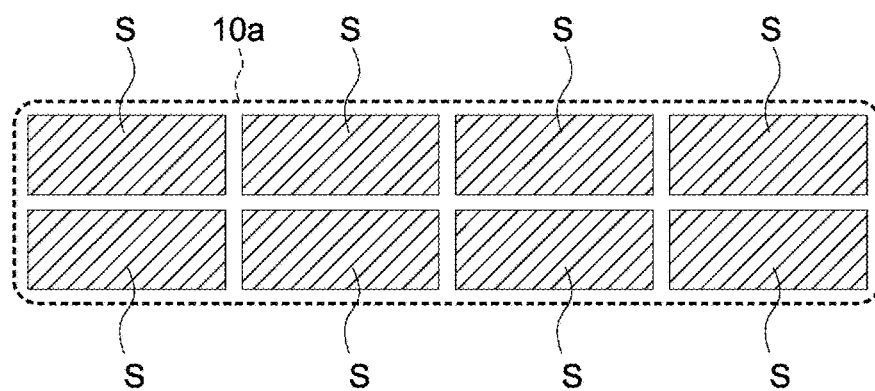
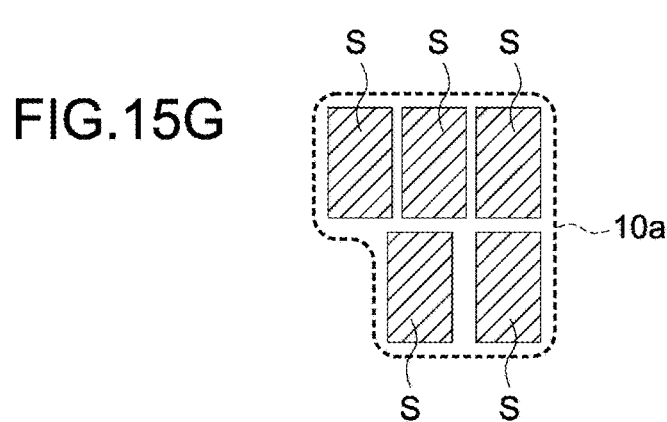
FIG.15G

DEFORMABLE KEYBOARD WITH ADJUSTABLE LAYOUT

TECHNICAL FIELD

This application claims the benefit of Japanese Priority Patent Application JP 2013-010448 filed Jan. 23, 2013, the entire contents of which are incorporated herein by reference.

The present technology relates to an input apparatus, an electronic device and a sensor sheet capable of electrostatically detecting an input operation.

BACKGROUND ART

In a so-called keyboard widely used as a key input apparatus, a sinking (a stroke) and a feeling (a click feeling) provided when a predetermined key is pressed by a finger enable a good and stable key input. For example, Patent Literature 1 describes a keyboard including a membrane switch having contact points composed of a pair of electrodes disposed at a position corresponding to the key, and a key member disposed facing to the contact point such that the contact points are contacted by pushing down the key member.

On the other hand, there is also known an input apparatus capable of key inputting by touching a keyboard displayed on a display. For example, Patent Literature 2 discloses an input device where GUI parts such as a software keyboard are displayed on a touch panel having a function of a display device, and when a key displayed is touched, the key is displayed.

CITATION LIST

Patent Literature

PTL 1: Japanese Patent Application Laid-open No. 2012-129140
PTL 2: Japanese Patent Application Laid-open No. 2012-146267

SUMMARY

Technical Problem

In recent years, a thin keyboard is demanded. By the configuration described in Patent Literature 1, thinning of the keyboard is limited. Also, as the contact points should be positioned corresponding to each key, the positions of the contact points should be undesirably changed depending on key layouts.

On the other hand, in the input apparatus described in Patent Literature 2, an operator cannot rest fingers on keys displayed on a screen, and has to touch a desired key area while the fingers are always floated. Thus, operability is low. In addition, the stroke feeling and the click feeling cannot be provided, and there is a disadvantage of being unsuitable for a high-speed input.

In view of the circumstances as described above, there is a need to provide an input apparatus, an electronic device and a sensor sheet capable of accepting a plurality types of possible key layouts while providing operability of a key input.

Solution to Problem

According to an embodiment of the present technology, there is provided an input apparatus including an operational member, an electrode substrate and a support.

The operational member has a plurality of key areas.

The electrode substrate has a plurality of first electrode lines and a plurality of second electrode lines disposed facing to a plurality of the first electrode lines and crossing with a plurality of the first electrode lines and is capable of electrostatically detecting a change in a distance to each of a plurality of the key areas.

The support has a plurality of structures, first spaces and second spaces. A plurality of the structures connects the electrode substrate and the operational member. The first spaces are formed between a plurality of the structures corresponding to each of a plurality of the key areas. The second spaces are formed between a plurality of the structures common to a predetermined plurality of the key areas.

The input apparatus allows an input operation to the key areas to be detected utilizing a change in capacitances of the first and second electrode lines on the electrode substrate based on a change in a facing distance to the key areas. In this way, the input operation becomes possible while the fingers and the like are rest on the operational member, thereby preventing the operability from degrading. The respective areas are supported on the electrode substrate via the first and second spaces formed between a plurality of the structures, thereby providing the predetermined stroke feeling and the click feeling.

In addition, the second spaces are formed common to a predetermined plurality of the key areas dissimilar to the first spaces formed corresponding to the respective key areas. It is therefore possible to freely change the number or the position of the key areas in the second space. Furthermore, a common support and a common electrode substrate can be used for a plurality types of the operational members having different key layouts in the second space.

The electrode substrate may have a plurality of detector sections. A plurality of the detector sections are formed at crossing regions of a plurality of the first electrode lines and a plurality of the second electrode lines, and are configured such that capacitance is variable depending on a relative distance to a plurality of the key areas.

Typically, a plurality of the detector sections are disposed corresponding to a plurality of the key areas of the operational member, may not match the number or the layout of the key areas, and may be designed to have the number or the layout so that the input operation of each of the key areas can be detected.

In this case, a plurality of the structures is disposed on non-crossing regions of a plurality of the first electrode lines and a plurality of the second electrode lines.

In this way, as the number of the detector sections facing to the respective key areas increases, a detection sensitivity of the key input operation can be improved.

Typically, a plurality of the detector sections includes a predetermined plurality of the detector sections capable of detecting an input operation to a predetermined plurality of the key areas. A predetermined plurality of the detector sections may be disposed on the second spaces such that the number of a predetermined plurality of the detector sections is greater than the number of a predetermined plurality of the key areas, or may be disposed on the second spaces at arrangement pitches different from those of a predetermined plurality of the key areas.

In this way, layout freedom of the key areas in the second spaces can be increased.

The support may further have a through hole capable of communicating a plurality of the first spaces and a plurality of the second spaces with outside air.

By providing the support with the through hole, internal pressures of the first and second spaces can be changed depending on an outside pressure. This allows stable operability can be assured not depending on usage environment.

The operational member may further have a conductor layer that is partly deformable corresponding to the input operation to a plurality of the key areas against the electrode substrate.

Thus, an adequate input operation is possible even when a user wears gloves, for example.

The input apparatus may further include a control unit. The control unit is electrically connected to the electrode substrate, and is capable of generating information about the input operation to each of a plurality of the key areas based on outputs from a plurality of the detector sections.

The control unit may have a memory, and an arithmetic unit. The memory stores key layout information about a plurality types of operational members having different layouts of a plurality of the key areas. The arithmetic unit executes input determination to a predetermined plurality of the key areas based on the key layout information stored in the memory and the outputs from a plurality of detector sections.

By this configuration, the adequate input operation can be determined on a plurality of the operational members having different key layouts.

The arithmetic unit may generate different control signals depending on the amount of the capacitance change in at least one detector section among a plurality of the detector sections.

It is thus possible not only to determine on/off of the key areas but also to determine whether or not the key areas are touched as well as an operational force or the like.

Alternatively, the arithmetic unit may generate a control signal when the amount of the capacitance change in at least one detector section among a plurality of the detector sections exceeds a predetermined value.

By this configuration, since the control signal is outputted to the device main unit (processing apparatus) only when an operation to be controlled is done, it is possible to decrease a signal throughput in the device main unit.

On the other hand, the control unit may be configured such that information about a position of an operational object adjacent to the operational member can be generated based on the capacitance change in a plurality of the first electrode lines and a plurality of the second electrode lines.

In this way, it is possible to detect the finger movement on the operational members. The input apparatus can be used as a pointing device.

The input apparatus may further includes a light source capable of emitting an illuminated light to illuminate a plurality of the key areas. The operational member is composed of a light transmitting material capable of transmitting the illuminated light.

This allows visibility of each key area to be increased.

The light source may be disposed on anywhere, e.g., on the operational member, the electrode substrate or the like.

When the light source is disposed on the operational member, the operational member has a first surface where the input operation is made by the user, a second surface facing to the support, a light guide section formed between the first surface and the second surface and having a side face, and a diffuser section formed on the second surface diffusing the illuminated light to a plurality of the key areas.

The diffuser section may be configured of a concave/convex section formed on the second surface, or a bonded section of the second surface and a plurality of the structures.

When the light source is disposed on the electrode substrate, the electrode substrate supports a plurality of the first electrode lines and a plurality of the second electrode lines, and further has a base material composed of a light transmitting material capable of transmitting the illuminated light and having a side face. The light source is disposed on the side face of the base material. A plurality of the structures is composed of a light transmitting material capable of transmitting the illuminated light.

The light source may be disposed on a back face of the base material. In this case, the electrode substrate supports a plurality of the first electrode lines and a plurality of the second electrode lines, and further has a base material composed of a light transmitting material capable of transmitting the illuminated light. A plurality of the structures is composed of a light transmitting material capable of transmitting the illuminated light, and the light source is composed of a sheet-like light source facing to the operational member via the electrode substrate.

According to an embodiment of the present technology, there is provided an electronic device including an operational member, an electrode substrate, a support and a controller.

The operational member has a plurality of key areas.

The electrode substrate has a plurality of first electrode lines and a plurality of second electrode lines disposed facing to a plurality of the first electrode lines and crossing with a plurality of the first electrode lines, and is capable of electrostatically detecting a change in a distance to each of a plurality of the key areas.

The support has a plurality of structures, first spaces and second spaces. A plurality of the structures connects the electrode substrate and the operational member. The first spaces are formed between a plurality of the structures corresponding to each of a plurality of the key areas. The second spaces are formed between a plurality of the structures common to a predetermined plurality of the key areas.

The controller has a control unit electrically connected to the electrode substrate, and is capable of generating information about the input operation to each of a plurality of the operational members based on outputs from a plurality of the detector sections.

According to an embodiment of the present technology, there is provided a sensor sheet including a first wiring substrate, a second wiring substrate, and a support.

The first wiring substrate has a plurality of first electrode lines.

The second wiring substrate is disposed facing to the first wiring substrate, and has a plurality of second electrode lines and forms detector sections at crossing regions of a plurality of the first electrode lines and a plurality of the second electrode lines.

The support is disposed on the first wiring substrate, and includes a plurality of structures, a first concave part and a second concave part. A plurality of the structures is disposed on non-crossing regions of a plurality of the first electrode lines and a plurality of the second electrode lines. The first concave part is formed between a plurality of the structures, and houses at least one detector section. The second concave part is formed between a plurality of the structures, and house two or more detector sections.

Advantageous Effects of Invention

As described above, according to the present technology, a plurality types of possible key layouts is accepted while providing operability of a key input.

BRIEF DESCRIPTION OF DRAWINGS

FIG. 15D is a schematic diagram illustrating a relationship between a key area and a sensor area corresponding to the key area in the input apparatus.

FIG. 15E is a schematic diagram illustrating a relationship between a key area and a sensor area corresponding to the key area in the input apparatus.

FIG. 15F is a schematic diagram illustrating a relationship between a key area and a sensor area corresponding to the key area in the input apparatus.

FIG. 15G is a schematic diagram illustrating a relationship between a key area and a sensor area corresponding to the key area in the input apparatus.

DESCRIPTION OF EMBODIMENTS

Figure 1:
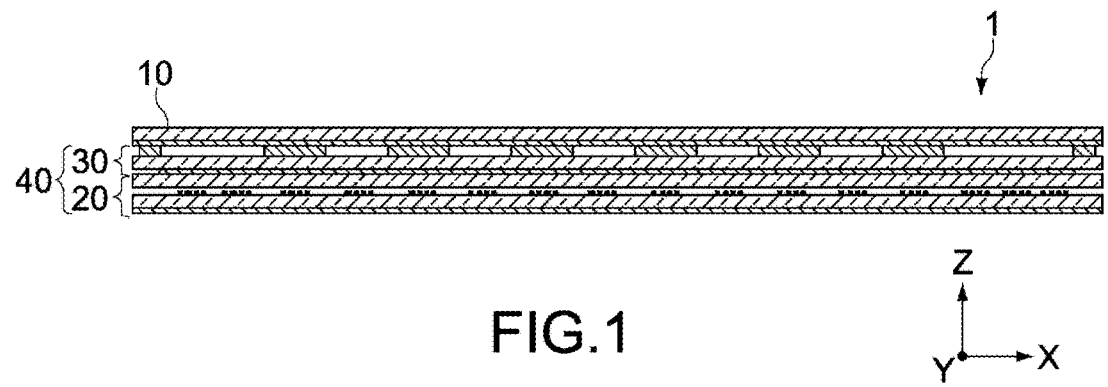
FIG. 1 is a schematic cross-sectional view of an input apparatus according to a first embodiment of the present technology.

Hereinbelow, the embodiments according to the present technology will be described referring to the drawings.

First Embodiment

Figure 2:
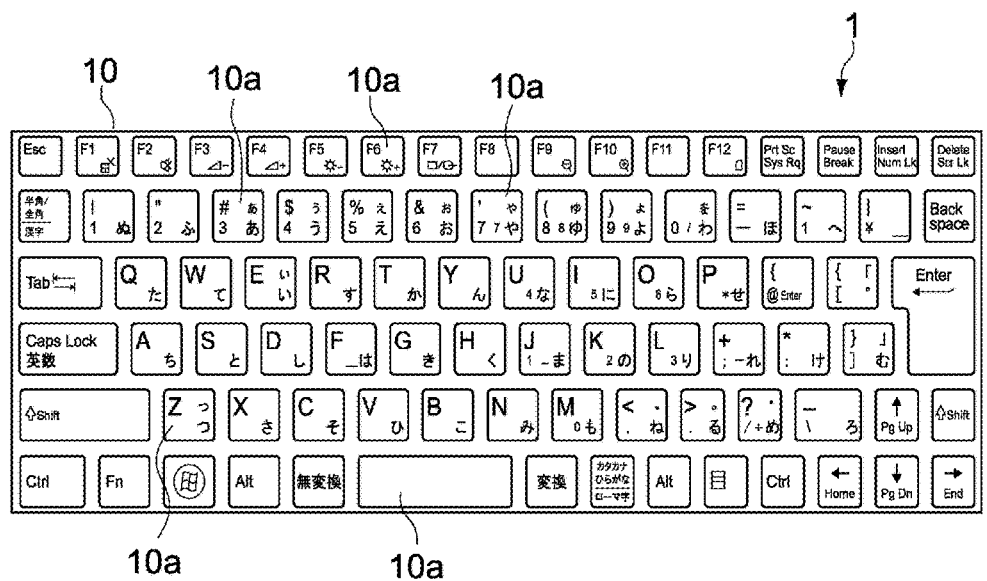
FIG. 2 is a plan view of the input apparatus.
Figure 3:
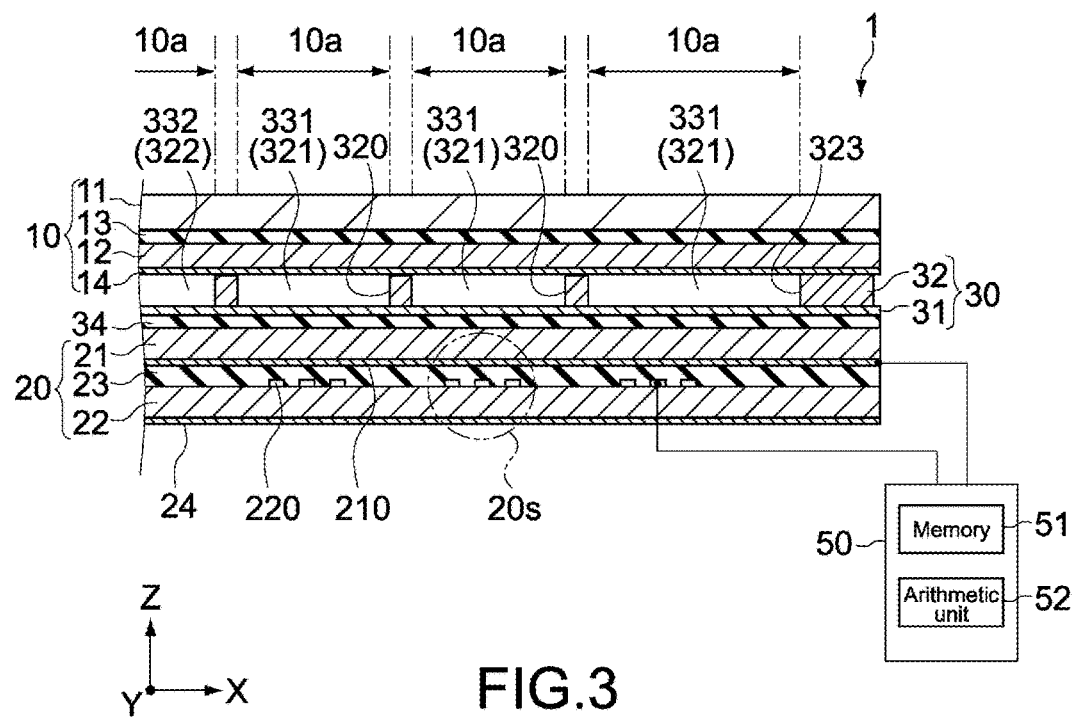
FIG. 3 is an enlarged cross-sectional view of a main part of the input apparatus.

FIG. 1 is a schematic cross-sectional view of an input apparatus 1 according to a first embodiment of the present technology. FIG. 2 is a plan view of the input apparatus 1. FIG. 3 is an enlarged cross-sectional view of a main part of the input apparatus 1. Hereinafter, a configuration of the input apparatus 1 according to the present embodiment will be described. In FIGS. 1 to 3, an X axis and a Y axis represent directions orthogonal to each other (in-plane directions in the input apparatus 1). A Z axis represents a direction orthogonal to the X axis and the Y axis (a thickness direction in the input apparatus 1).

(Input Apparatus)

The input apparatus 1 includes an operational member 10, an electrode substrate 20 and a support 30. An example of the input apparatus according to the present embodiment is a key board apparatus of a computer.

The operational member 10 has a plurality of key areas 10a.

The electrode substrate 20 includes a plurality of first electrode lines 210 and a plurality of second electrode lines 220 that are intersected with a plurality of the first electrode lines 210, and can electrostatically detect a change in distance to each of a plurality of the key areas 10a. The support 30 includes a plurality of structures 320, first spaces 331 and second spaces 332. A plurality of structures 320 connects the electrode substrate 20 and the operational member 10. The first spaces 331 are formed between a plurality of the structures 320 corresponding to the respective plurality of the key areas 10a. The second spaces 332 are formed between a plurality of the structures 320 common to the predetermined plurality of the key areas 10a.

(Operational Member)

According to the present embodiment, the operational member 10 has a laminated structure of a flexible sheet 11 and a base material 12.

The flexible sheet 11 is a flexible insulated plastic sheet composed of PET (polyethylene terephthalate), PEN (polyethylene naphthalate), PMMA (polymehtylmethacrylate), PC (polycarbonate), PI (polyimide) or the like, for example. The flexible sheet 11 may have a non-limiting thickness, and has a thickness of several tens micro m to several hundreds micro m, for example. On a surface of the operational member 10, a plurality of the key areas 10a are arranged.

The base material 12 is a flexible insulated plastic sheet composed of PET, PEN, PMMA, PC, PI or the like, for example. The base material 12 may have a non-limiting thickness, and has a thickness of several tens micro m to several hundreds micro m, for example. A surface of the base material 12 is bonded to a rear surface of the flexible sheet 11 via a bonding layer 13.

At the rear surface of the substrate layer 12, a conductor layer 14 composed of a metal foil including Cu (copper), Au (aluminum) or the like or a mesh material is disposed. The conductor layer 14 can be partly deformed corresponding to an input operation to a plurality of the key areas 10a against the electrode substrate 20. The conductor layer may have a non-limiting thickness, and has a thickness of several tens micro m to several hundreds micro m, for example. The conductor layer 14 is connected to a ground potential, for example.

The substrate 12 and the conductor layer 14 may be composed of a composite sheet where a metal foil is adhered to a resin sheet in advance; a vapor deposited film or a sputter film formed on the substrate 12; or a coated film where a conductive paste is printed on the substrate 12.

Each key area 10a corresponds to a key top which is pressed for operation by a user, and has a shape and a size depending on a type of a key. Each key area 10a may have an adequate key top indication. The key top indication may represent the type of the key, a position (outline) of the key, or both. The indication can be printed as appropriate by a screen printing, a flexography printing, or a gravure printing, for example.

Figure 4A:
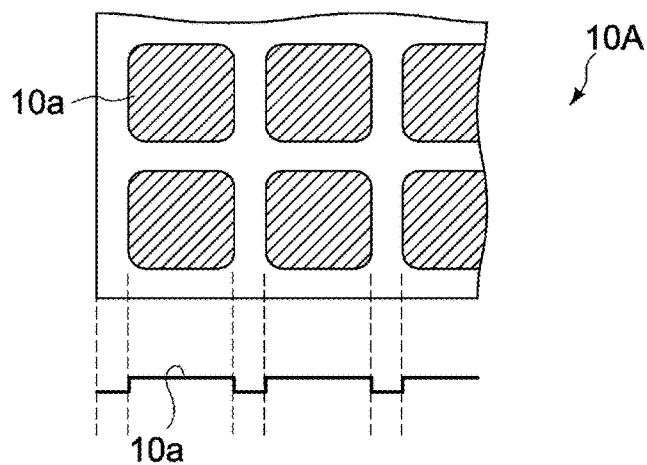
FIG. 4A is a main part plan and sectional view showing an alternative embodiment of an operational member configuration in the input apparatus.
Figure 4B:
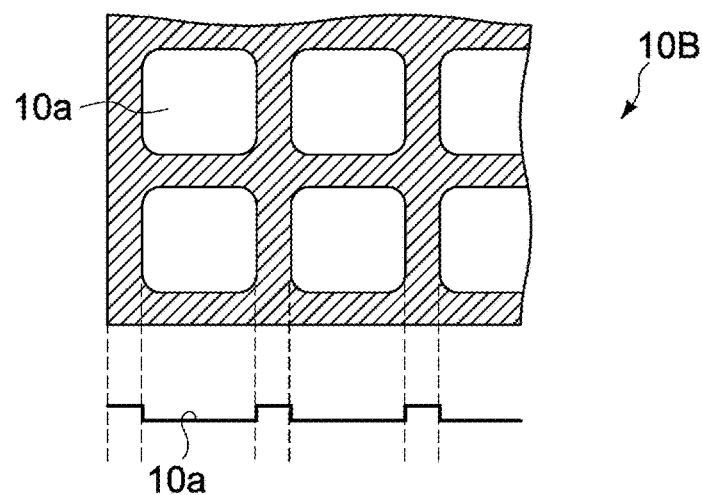
FIG. 4B is a main part plan and sectional view showing an alternative embodiment of an operational member configuration in the input apparatus.
Figure 4C:
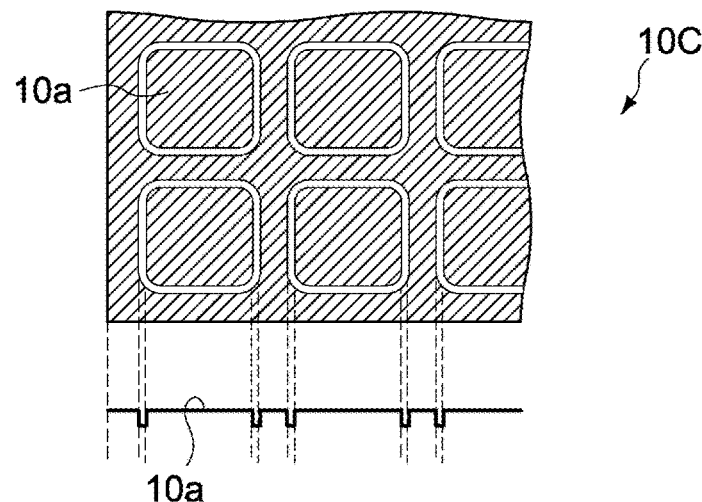
FIG. 4C is a main part plan and sectional view showing an alternative embodiment of an operational member configuration in the input apparatus.

The operational member 10 is not limited to a flat sheet as a whole, but may have predetermined concave/convex key areas 10a, for example. FIGS. 4A to 4C show operational member configurations having different key area 10a configurations. In each drawing, an upper is a main part plan view and a lower is a sectional view. For ease of understanding, a convex surface (a topmost surface) of the sheet is hatched in each drawing.

The operational member 10A shown in FIG. 4A has the key areas 10a that are protruded upward. The operational member 10B shown in FIG. 4B has the key areas 10a that are sunk downward. The operational member 10C shown in FIG. 4C has grooves around the key areas 10a. In any of the configuration examples, the key areas 10a are formed by press forming the operational member 10A, 10B or 10C, and can be deformed separately in a vertical direction (a sheet thickness direction).

Figure 5A:
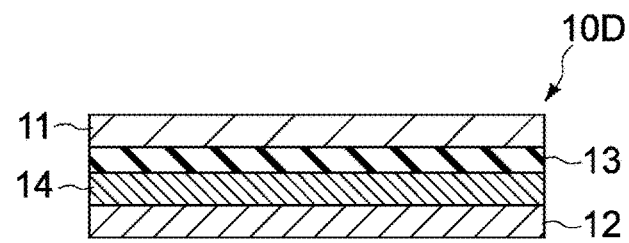
FIG. 5A is a schematic cross-sectional view showing an alternative embodiment of an operational member configuration in the input apparatus.
Figure 5B:
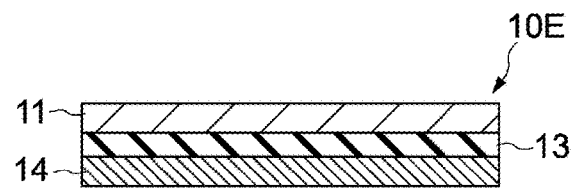
FIG. 5B is a schematic cross-sectional view showing an alternative embodiment of an operational member configuration in the input apparatus.

The configurations of the operational member 10 are not limited thereto. FIGS. 5A and 5B each shows a schematic cross-sectional view of an alternative embodiment of the operational member 10. An operational member 10D shown in FIG. 5A has a configuration that the conductor layer 14 is disposed between the base material 12 and the bonding layer 13. An operational member 10E shown in FIG. 5B has a configuration that the conductor layer 14 is bonded to the rear surface of the flexible sheet 11 via the bonding layer 13.

The operational member 10 may be configured only of the flexible sheet 11 and the conductor layer 14. The concave/convex key areas 10a can be formed by an appropriate processing technique including press forming, etching, laser processing or the like. Alternatively, a concave/convex flexible sheet 11 may be formed by a forming technique including injection molding. In this case, the conductor layer 14 may be a vapor deposition film or a sputter film formed on the rear surface of the flexible sheet, or may be a coated film where the conductive paste is printed on the rear surface of the flexible sheet. Other than the above, as long as the conductor layer 14 is disposed on the rear surface of the flexible sheet 11, the configuration of the operational member 10 is not especially limited.

In addition, the flexible sheet 11 may be composed of a conductive material such as a metal. In this way, the base material 12, the bonding layer 13 and the conductor layer 14 are unnecessary and the operational member 10 can be thin. In this case, the flexible sheet 11 also functions as the conductor layer 14, and is connected, for example, to the ground potential.

(Electrode Substrate)

Figure 6:
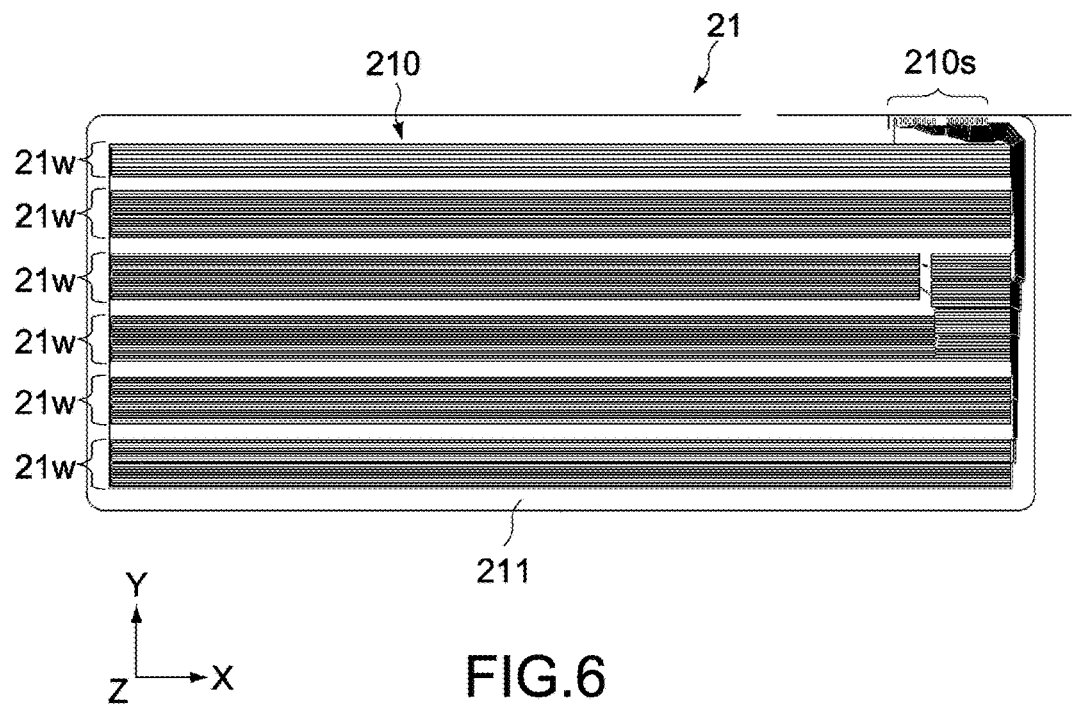
FIG. 6 is a plan view of a first wiring substrate configuring an electrode substrate in the input apparatus.
Figure 7:
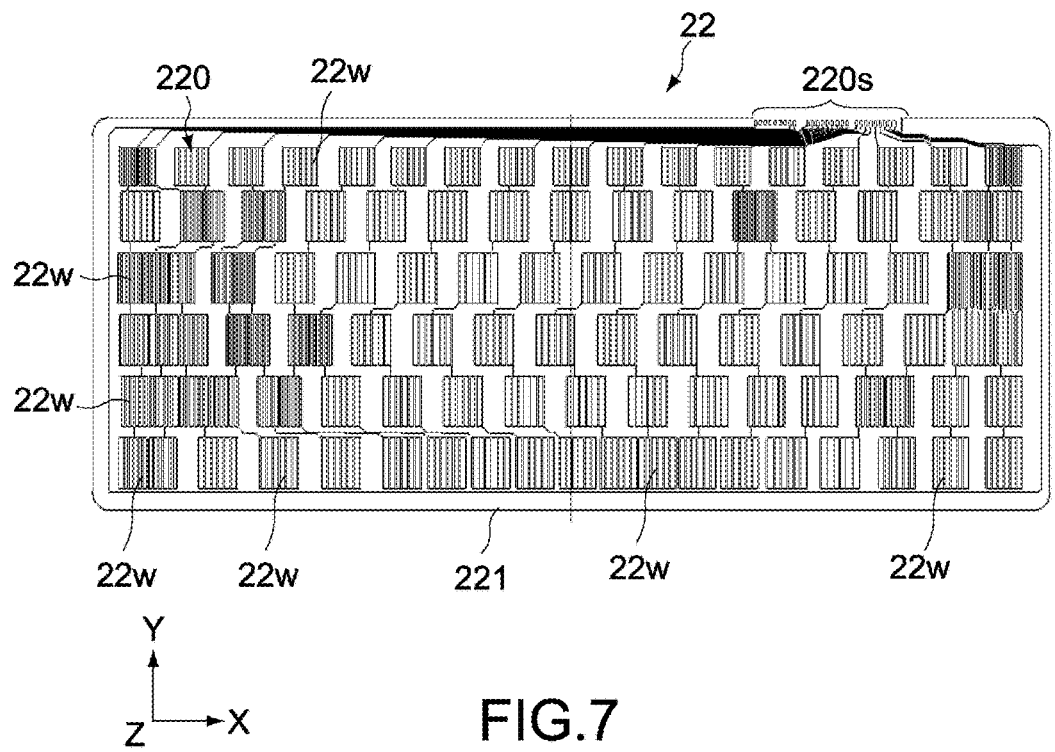
FIG. 7 is a plan view of a second wiring substrate configuring the electrode substrate.

The electrode substrate 20 is a lamination of a first wiring substrate 21 having first electrode lines 210 and a second wiring substrate 22 having second electrode lines 220. FIG. 6 is a plan view of the first wiring substrate 21, and FIG. 7 is a plan view of the second wiring substrate 22.

The first wiring substrate 21 includes a first base material 211 and a plurality of first electrode lines (Y electrodes) 210. The first base material 211 is composed of an electrically insulated plastic sheet including PET, PEN, PC, PMMA or the like, a glass substrate, a glass epoxy substrate or the like. The first base material 211 may have a non-limiting thickness, and has a thickness of several tens micro m to several hundreds micro m, for example.

A plurality of the first electrode lines 210 is integrally disposed on one surface of the first base material 211, and is formed almost linearly along an X axis direction. A plurality of the first electrode lines 210 is composed of a plurality of electrode groups 21w arranged along a Y axis direction at predetermined intervals. The predetermined intervals correspond to arrangement intervals of respective columns of the key areas 10a along the Y axis direction. The electrode groups 21w are disposed directly below the respective columns of the key areas 10a arranged along the Y axis direction (at the area including positions facing to the respective columns of the key areas 10a and to a Z axis direction).

Each of the first electrode lines 210 is connected to each terminal of extraction parts 210s disposed on one end of the first base material 211. A plurality of the electrode groups 21w is connected to separate terminals. A plurality of the electrode lines of the respective electrode groups 21w may be connected to a common terminal or two or more separate terminals. The extraction parts 210s are electrically connected to a control unit 50.

On the other hand, the second wiring substrate 22 includes a second base material 221 and a plurality of second electrode lines (X electrodes) 220. The second base material 221 is composed of an electrically insulated plastic sheet including PET, PEN, PC, PMMA or the like, a glass substrate, a glass epoxy substrate or the like similar to the first base material 211. The second base material 221 may have a non-limiting thickness, and has a thickness of several tens micro m to several hundreds micro m, for example. The second wiring substrate 22 is disposed facing to the first wiring substrate 21.

A plurality of the second electrode lines 220 is integrally disposed on one surface of the second base material 221, and is arranged along the X axis direction. The second electrode lines 220 in respective rows are formed to follow predetermined paths in the Y axis direction, and are composed of electrode groups 22w branched into plural directly under the key areas 10a (at the area including positions facing to the key areas 10a and to the Z axis direction).

Each of the second electrode lines 220 is connected to each terminal of extraction parts 220s disposed on one end of the second base material 221. The second electrode lines 220 in respective rows are connected to separate terminals. The extraction parts 220s are electrically connected to the control unit 50.

The first electrode lines 210 and the second electrode lines 220 are formed on the first base material 211 and the second base material 221, respectively by etching of a metal foil such as Al and Cu or by printing of a metal paste such as Ag (silver). The first base material 211 and the second base material 221 may be formed of flexible sheet materials or inflexible sheet materials.

As shown in FIG. 3, the electrode substrate 20 includes a bonding layer 23 for mutually bonding the first wiring substrate 21 and the second wiring substrate 22. The bonding layer 23 has electrical insulating properties, and is made, for example, of a cured bonding agent, an adhesive material such as an adhesive tape or the like.

According to the present embodiment, the first wiring substrate 21 and the second wiring substrate 22 are mutually bonded such that the first electrode lines 210 and the second electrode lines 220 are mutually faced. However, it is not limited thereto, and the first wiring substrate 21 and the second wiring substrate 22 are mutually bonded such that the first electrode lines 210 and the second electrode lines 220 face each other via the first base material 211 or the second base material 221, or both. According to the present embodiment, the first wiring substrate 21 is laminated over the second wiring substrate 22. However, it is not limited thereto, and the second wiring substrate 22 may be laminated over the first wiring substrate 21.

The electrode substrate 20 includes a plurality of detector sections 20s formed at the crossing regions of the first electrode lines 210 and the second electrode lines 220. The detector sections 20s are configured such that capacitance can be varied depending on a relative distance to the key areas 10a. The detector section 20s is a capacitive element including the first electrode lines 210, the second electrode lines 220 facing to the first electrode lines 210, and a dielectric layer (the bonding layer 23) disposed between the first and second electrode lines 210 and 220. Initial capacitance of the detector sections 20s is set depending on a facing area between the first and second electrode lines 210 and 220, a facing distance between the first and second electrode lines 210 and 220 and a dielectric constant of the bonding layer 23.

The electrode substrate 20 can electrostatically detect a change in the distance from a plurality of the key areas 10a. In the present embodiment, the detector sections 20s are mainly formed at the crossing regions of the first electrode groups 21w of the first electrode lines 210 and the second electrode groups 22w of the second electrode lines 220. As described above, the first electrode groups 21w and the second electrode groups 22w are disposed directly under the respective key areas 10a. Thus, the respective detector sections 20s are disposed directly under the respective key areas 10a. The detector sections 20s detect approach of the key areas 10a through a capacitance change in the detector sections 20s themselves caused by an electrostatic coupling with the conductor layer 14 approaching to the electrode substrate 20 together with the key areas 10a pressed for operation. The electrode substrate 20 includes information about an amount of the capacitance change in the detector sections 20s, and outputs a signal for specifying the key areas 10a pressed for operation to the control unit 50.

The electrode substrate 20 further includes a shield layer 24. The shield layer 24 is composed of a metal foil, a metal mesh material or a coated film of the conductive paste, and is disposed on a rear surface of the second wiring substrate 22. The shield layer 24 has a function to block an electromagnetic noise incident on capacitative element 20s externally from the input apparatus 1. The shield layer 24 is typically connected to the ground potential.

(Support)

The support 30 is disposed between the operational member 10 and the electrode substrate 20. The support 30 includes a plurality of structures 320, first concave parts 321 for forming the first spaces 331, second concave parts 322 for forming the second spaces 332, and a frame 323.

As shown in FIG. 3, the support 30 according to the present embodiment has a laminated structure including a substrate 31 and a structure layer 32 disposed on a surface (an upper face) of the substrate 31. The substrate 31 is composed of an electrically insulated plastic sheet including PET, PEN, PC or the like. The substrate 31 may have a non-limiting thickness, and has a thickness of several tens micro m to several hundreds micro m, for example. The structure layer 32 is composed of an electrically insulated resin material such as a ultraviolet curing resin, and forms a plurality of structures 320, first concave parts 321, second concave parts 322, and a frame 323 on the substrate 31.

Figure 8:
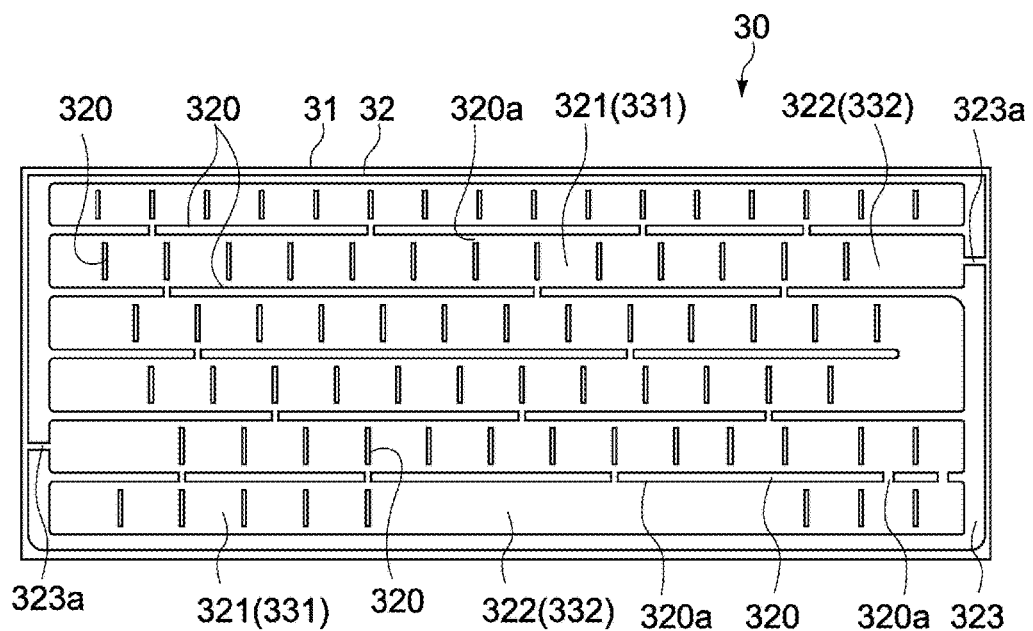
FIG. 8 is a plan view of a support in the input apparatus.
Figure 9:
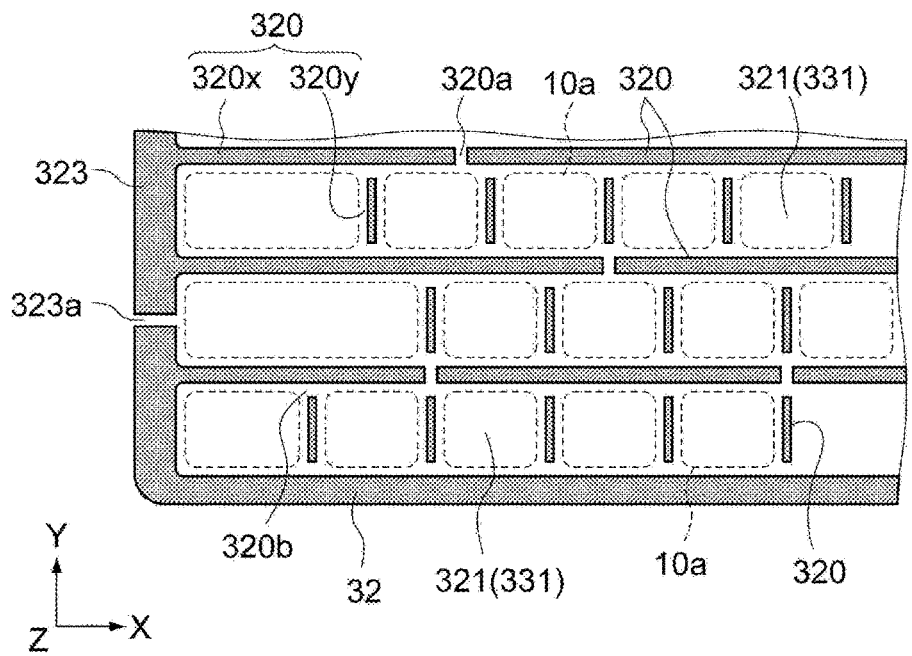
FIG. 9 is a main part enlarged view of FIG. 8.

FIG. 8 is a plan view of the support 30. FIG. 9 is a main part enlarged view of FIG. 8.

A plurality of the structures 320 connects the electrode substrate 20 and the operational member 10 such that the key areas 10a at the operational member 10 are separated, and forms the first concave parts 321 and the second concave parts 322 between a plurality of the structures 320. The frame 323 is formed on the substrate 31 to surround a peripheral of the substrate 31. The structures 320 and the frame 323 are disposed on the surface of the substrate 31 at the same height (several tens micro m to several hundreds micro m, for example).

According to the present embodiment, a plurality of the structures 320 includes a plurality of first structure sections 320x extending in the X axis direction and a plurality of second structure sections 320y extending in the Y axis direction. The first structure sections 320x are disposed between a plurality of the key areas arranged in the Y axis direction. The second structure sections 320y are disposed between a plurality of the key areas arranged in the X axis direction.

The first structure sections 320x and the second structure sections 320y are disposed on non-crossing regions of the first electrode lines 210 and the second electrode lines 220 on the electrode substrate 20 viewing from the Z axis direction. The first concave parts 321 are formed between a plurality of the structures 320 (320x, 320y), and house at least one detector section 20s on the electrode substrate 20 viewing from the Z axis direction. On the other hand, the second concave parts 322 are formed between a plurality of the structures 320 (320x, 320y), and house two or more detector sections 20s on the electrode substrate 20 viewing from the Z axis direction.

By disposing a plurality of the structures 320 at the non-crossing regions of the first electrode lines 210 and the second electrode lines 220, it becomes easy to partly deform the key areas 10a. This enables to provide the stroke feeling and the click feeling upon operation, and good operability of the key input can be assured. In addition, unintentional simultaneous inputs can be inhibited between a plurality of key areas 10a adjacent via the structure 320. Furthermore, the detection sensitivity can be enhanced when the key areas 10a are pressed for operation.

Typically, the structure 320 is composed of a relatively stiff material. However, the structure 320 may be composed of an elastic material that can be deformed together with the operational member 10 when the key is inputted. In other words, an elastic modulus of the structure 320 is not especially limited, and the material can be selected as appropriate as long as intended operational feeling and the detection sensitivity can be provided.

The support 30 is disposed between the operational member 10 and the electrode substrate 20 such that the substrate 31 faces to the electrode substrate 20 and the structure layer 32 faces to the operational member 10. The first concave parts 321 form the first spaces 331 between the operational member 10 and the electrode substrate 20. The second concave parts 322 form the second spaces 332 between the operational member 10 and the electrode substrate 20. The first spaces 331 are formed corresponding to the respective key areas 10a on the operational member 10. The second spaces 332 are formed common to the predetermined plurality of the key areas 10a on the operational member 10.

Figure 10:
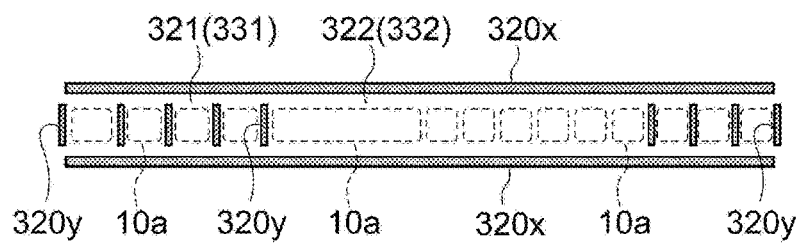
FIG. 10 is a main part plan view of a bottommost area in the support shown in FIG. 8.

FIG. 10 shows a bottommost area separated by the first structure sections 320x in the support 30 shown in FIG. 8. As shown in FIGS. 9 and 10, each of the first concave parts 321 (each of the first spaces 331) is formed corresponding to each of the key areas 10a, and the second concave parts 322 (the second spaces 332) are formed to house a plurality of the key areas 10a.

The positions where the first concave parts 321 and the second concave parts 322 are formed are not especially limited and can be selected as appropriate depending on the size, the shape and the arrangement of the key. According to the present embodiment, since the support 30 includes the first concave parts 321 as well as the second concave parts 322, the support 30 can be used not only for the operational member 10 having a certain key layout, but also for other operational member having a different key layout.

In other words, the key layout is generally determined depending on the country or region where it is used, the model, the standard or the like. For example, if the support 30 includes only the first concave parts 321, a dedicated support 30 is necessary for the operational member having the different key layout. This may cause unprofitable results in terms of management and costs. In contrast, when the support 30 includes the first concave parts 321 as well as the second concave parts 322 according to the present embodiment, a predetermined plurality of key areas having different shapes, sizes, arrangements or the like can be housed in a plurality types of the operational members having different key layouts common to the second concave parts 322. It is thus possible to apply the common support 30 to a plurality types of the operational members.

The input operation at each of the key areas 10a arranged on the second concave parts 322 (the second spaces 332) is detected using a plurality of the detector sections 20s arranged on the second concave parts 322. According to the present embodiment, the number of a plurality of the detector sections 20s disposed on the second spaces 332 is greater than the number of a plurality of the key areas 10a arranged on the positions corresponding to the second spaces 332. Arrangement pitches of a plurality of the detector sections 20s disposed on the second spaces 332 are different from those of a plurality of the key areas 10a arranged on the positions corresponding to the second spaces 332. In this way, the layout freedom of the key areas 10a in the second spaces 332 can be increased.

Although each of the first structure sections 320x may be successively formed in the X axis direction, spaces 320a are formed at appropriate positions as shown in FIG. 9 according to the present embodiment. Although the second structure sections 320y may be connected to the first structure sections 320x, the second structure sections 320y are separated from the first structure sections 320x as shown in FIGS. 8 and 9 according to the present embodiment. In this way, since the first spaces 331 are communicated with the second spaces 332, the first and second spaces 331 and 332 can be maintained at the same pressure, and variation or change of the operation feeling at a key position can be prevented.

In addition, according to the present embodiment, one or more through holes 323a is disposed on appropriate position(s) of the frame 323. For example, the through hole 323a is formed to penetrate a part of the frame 323 in the X axis direction or the Y axis direction such that the first spaces 331 and the second spaces 332 can be communicated with outside air. In this way, the internal pressures of the first and second spaces 331 and 332 can be changed depending on the outside pressure. This allows the stable operability can be assured not depending on the usage environment.

According to the present embodiment, the support 30 is bonded on the electrode substrate 20 via a bonding layer 34. The bonding layer 34 may be a bonding agent or an adhesive material such as an adhesive tape. The support 30 is connected to the operational member 10 using a structure layer 32. In this case, the structure layer 32 supports the operational member 10 and also bonds the support 30 to the operational member 10.

The structure layer 32 can be formed using a ultraviolet curing bonding agent, for example. Specifically, the structure layer 32 is formed as follows: Firstly, a structure layer pattern corresponding to the structures 320 and the frame 323 is formed on the surface of the substrate 31 by a transfer method or a printing method, for example. Thereafter, the structure layer pattern is irradiated with ultraviolet rays from a substrate 31 side while the structure layer pattern is intimately contacted with the conductor layer 14 of the operational member 10. In this way, the first and second spaces 331 and 332 can be formed together with the structure layer 32.

Bonding of the support 30 to the operational member 10 is not limited to the above. For example, the bonding layer may be formed on the surface of the conductor layer 14, and the support 30 (the structure layer 32) may be bonded to the operational member 10 via the bonding layer. In this case, the bonding layer may be formed on an entire surface of the conductor layer 14, or may be formed only at an area facing to the structures 320 and the frame 323.

Figure 11A:
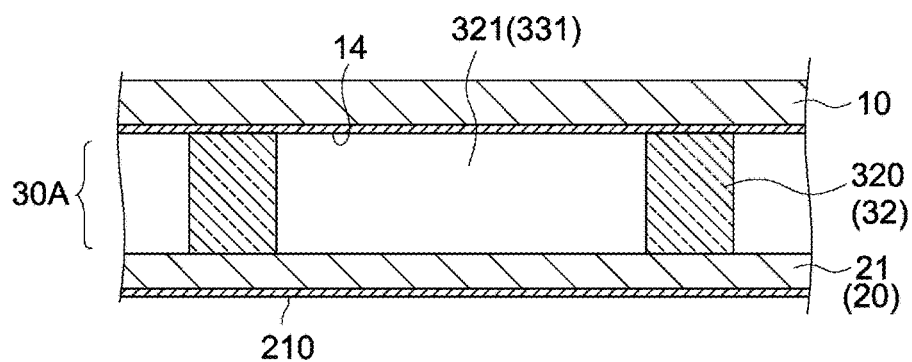
FIG. 11A is a main part schematic diagram showing an alternative embodiment of a support configuration.
Figure 11B:
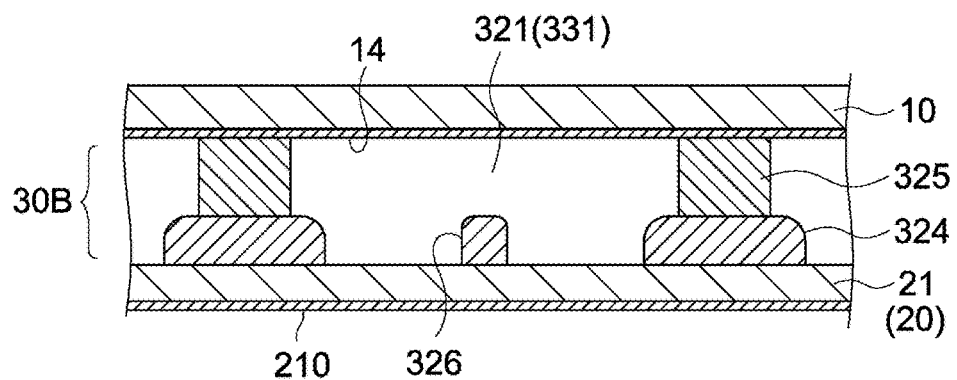
FIG. 11B is a main part schematic diagram showing an alternative embodiment of a support configuration.

The structure of the support 30 is not limited to the above. For example, the support 30 may not have the substrate 31. FIG. 11A shows a support 30A composed only of the structure layer 32. FIG. 11B shows a support 30B having a structure including resin layers 324 formed on the electrode substrate 20 and the bonding layers 325 that bonds the resin layers 324 to the operational member 10.

Figure 11C:
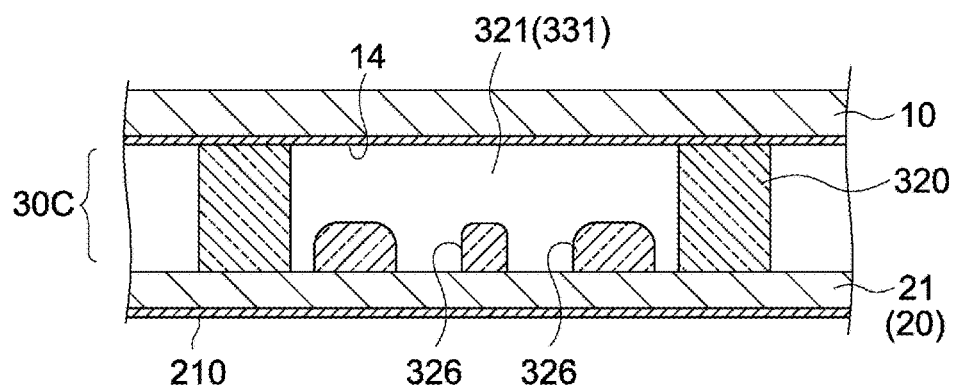
FIG. 11C is a main part schematic diagram showing an alternative embodiment of a support configuration.

The support 30B further includes a regulator unit 326 in the first concave parts 321 (the first spaces 331) to prevent the operational member 10 from contacting with the electrode substrate 20. The regulator unit 326 may be formed of the same resin material as the resin layer 324. FIG. 11C shows a support 30C including the structure layer 32 and the regulator units 326. The position, the number, the shape or the like of the regulator unit(s) 326 is not limited to those shown in FIGS. 11B and 11C, and can be selected as appropriate. The regulator unit 326 may have a non-limiting height as long as it is lower than the structure layer 32.

Figure 12:
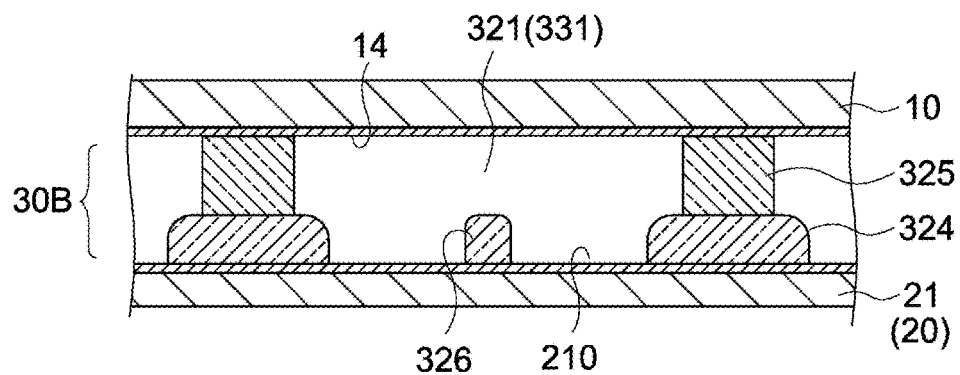
FIG. 12 is a main part schematic diagram showing an alternative embodiment of the support configuration.

The above-described supports 30A, 30B and 30C are formed on the electrode substrate 20 (the first wiring substrate 21) by an appropriate method such as the transfer method and the printing method. Herein, each support is disposed on the base material of the electrode substrate (the first base material 211), but it is not limited thereto. The support 30B may be disposed on the electrode lines of the electrode substrate (the first electrode lines 210). FIG. 12 shows a configuration example of the support 30B. The same may be applied to other supports including the supports 30, 30A and 30C.

(Sensor Sheet)

The electrode substrate 20 and the support 30 configure a sensor sheet 40 (FIG. 1). In other words, the sensor sheet 40 includes the first wiring substrate 21, the second wiring substrate 22 and the support 30.

As described above, the first wiring substrate 21 includes a plurality of the first electrode lines 210. The second wiring substrate 22 is disposed facing to the first wiring substrate 21, and includes a plurality of the second electrode lines 220 that form the detector sections 20s at crossing regions of a plurality of the first electrode lines 210 and a plurality of the second electrode lines 220. The support 30 includes a plurality of the structures 320, the first concave parts 321, the second concave parts 322. A plurality of the structures 320 is disposed on the non-crossing regions of a plurality of the first electrode lines 210 and a plurality of the second electrode lines 220. The first concave parts 321 are formed between a plurality of the structures 320, and house at least one detector section 20s. The second concave parts 322 are formed between a plurality of the structures 320, and house two or more detector sections 20s. The support 30 is disposed on the first wiring substrate 21.

(Control Unit)

The control unit 50 is electrically connected to the electrode substrate 20. Specifically, the control unit 50 is connected to the extraction parts 210s and 220s of the first and second wiring substrates 21 and 22. The control unit 50 configures a signal processing circuit that can generate information about the input operation to each of a plurality of the key areas 10a based on outputs from a plurality of the detector sections 20s. The control unit 50 scans each of a plurality of the detector sections 20s at a predetermined cycle, acquires an amount of the capacitance change in each detector section, and generates the information about the input operation based on the amount of the capacitance change.

Typically, the control unit 50 is composed of a computer including a CPU/MPU, a memory and the like. The control unit 50 may be composed of a single chip component, or a plurality of circuit components. The control unit 50 may be mounted to the input apparatus 1, or a device main unit (processing apparatus) connected to the input apparatus 1. In the former case, the control unit 50 is mounted to a flexible wiring substrate connected to the electrode substrate 20. In the latter case, the control unit 50 may be integrally constructed with a controller that controls the device main unit.

As shown in FIG. 3, the control unit 50 includes a memory 51 and an arithmetic unit 52. The memory 51 stores key layout information about a plurality types of operational members having different layouts of a plurality of the key areas 10a. The arithmetic unit 52 executes input determination to a plurality of the key areas 10a based on the key layout information stored in the memory 51 and the outputs from a plurality of detector sections 20s. It is thus possible to detect an adequate input operation to a plurality of the operational members having the different key layouts.

The arithmetic unit 52 generates different control signals depending on the amount of the capacitance change in at least one detector section 20s among a plurality of the detector sections 20s. It is thus possible not only to determine on/off of the key areas 10a but also to determine whether or not the key areas 10a are touched as well as an operational force or the like.

The arithmetic unit 52 generates a control signal when the amount of the capacitance change in at least one detector section 20s among a plurality of the detector sections 20s exceeds a predetermined value. By this configuration, since the control signal is outputted to the device main unit (processing apparatus) only when an operation to be controlled is done, it is possible to decrease a signal throughput in the device main unit.

(Detector Section)

Next, the detector sections 20s will be described.

Figure 13:
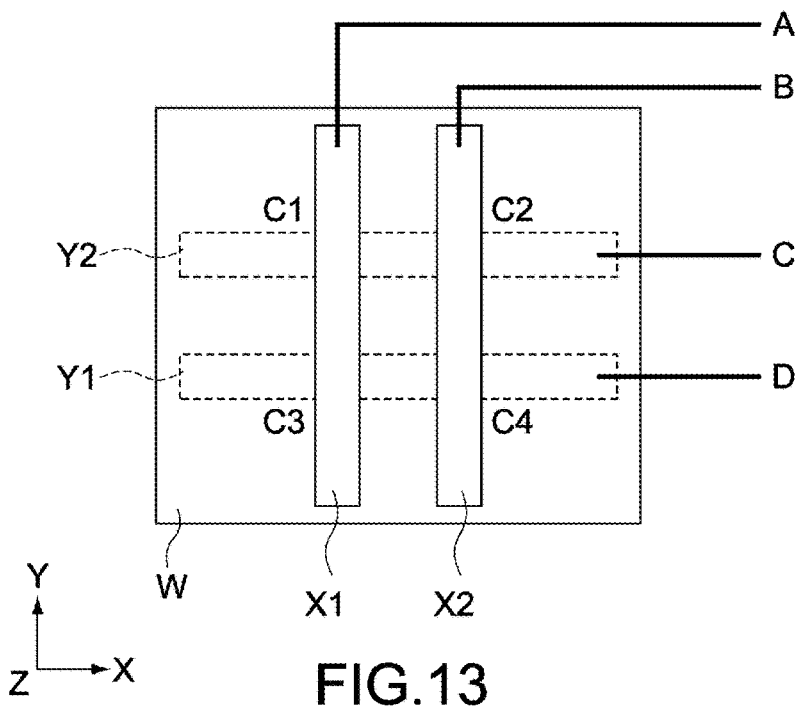
FIG. 13 is a plan view showing capacitive elements formed between electrodes being at right angles to each other.

The detector sections 20s are formed by mutual capacitance at crossing regions of a plurality of the first electrode lines 210 and a plurality of the second electrode lines 220 on the electrode substrate 20. FIG. 13 shows four capacitive elements C1, C2, C3 and C4 formed between two X electrodes X1 and X2 arranged in the X axis direction and two Y electrodes Y1 and Y2 arranged in the Y axis direction. The X electrodes X1 and X2 face to the Y electrodes Y1 and Y2 via an electrically insulated substrate W. Each of the electrodes X1, X2, Y1 and Y2 is connected to each of different terminals (channels) A, B, C and D. In this example, four capacitive elements C1 to C4 construct different four detector sections 20s. The capacitive elements C1 to C4 are independent each other. For example, when a voltage between the terminals A-C, B-C, A-D and B-D is monitored, the capacitive elements function as sensors (detector sections 20s) to detect a change in capacity.

Figure 14A:
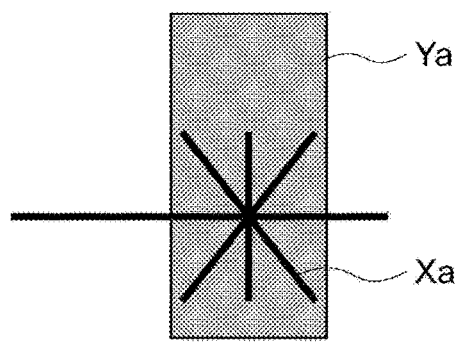
FIG. 14A is a main part plan view showing an alternative embodiment of two electrode configuration.
Figure 14B:
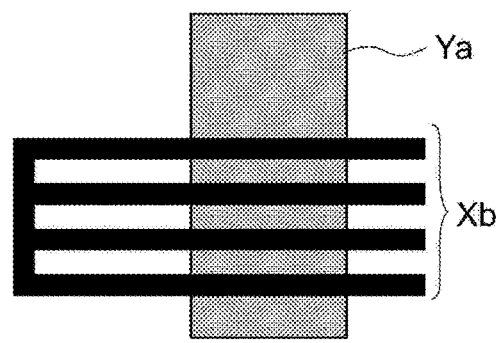
FIG. 14B is a main part plan view showing an alternative embodiment of two electrode configuration.

FIGS. 14A to 14D show alternative embodiments of the X and Y electrodes having different shapes. FIG. 14A shows a combination example of a radially formed X electrode Xa and an Y electrode Ya formed of a single line wider than the X electrodes Xa. FIG. 14B shows a combination example of a comb-shaped X electrode Xb and an Y electrode Yb formed of a single line. When the X electrode is formed radially or in a comb-shape, a facing area between the electrodes can be increased.

Figure 14C:
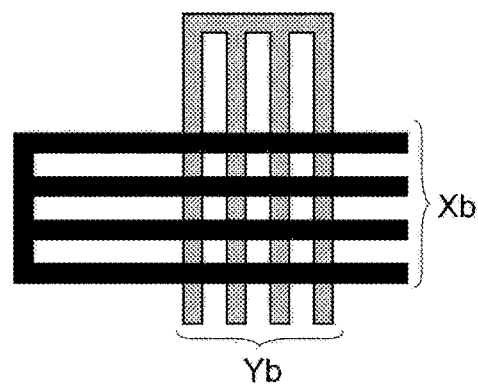
FIG. 14C is a main part plan view showing an alternative embodiment of two electrode configuration.
Figure 14D:
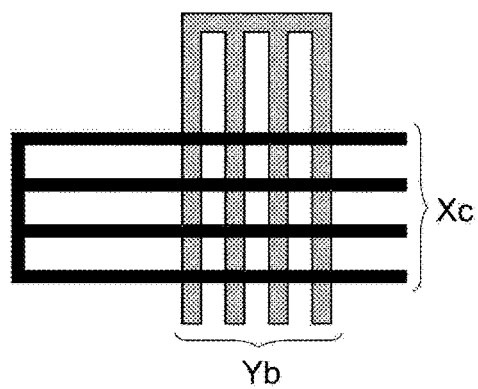
FIG. 14D is a main part plan view showing an alternative embodiment of two electrode configuration.

FIGS. 14C and 14D show examples of comb-shaped electrodes. When each electrode is formed in a comb-shape, a plurality of the mutual capacitances is formed between both electrodes, and a detection area can be increased. The number, the wide or the like of teeth may be same or different between the electrodes. FIG. 14C shows an example that the number and the width of the teeth are same in the X electrode Xb and the Y electrode Yb. FIG. 14D shows an example that the teeth of the X electrode Xc is thinner than those of the Y electrode Yb.

As described above, in the electrode substrate 20 according to the present embodiment, the respective detector sections 20s are formed at crossing regions of the electrode groups 21w and 22w. These electrode groups 21w and 22w correspond to the comb-shaped electrodes shown in FIG. 14C, for example, but it is not limited thereto. As shown in FIGS. 13, 14A and 14B, at least one of the X electrode and the Y electrode may be configured of a single wiring.

The X electrode and the Y electrode may be formed of the conductive paste using a printing method including a screen printing, a gravure offset printing and an inkjet printing. Alternatively, the X electrode and the Y electrode may be formed of a metal foil or a metal layer by a patterning method using a photolithography technique.

The input apparatus 1 according to the present embodiment has the following configurations in terms of the number or the position of the sensors (detector sections 20s) in the key areas 10a:

1. The size or the number of the sensors is changed depending on the size or the shape of the keys.

2. One sensor sheet can accept a plurality of possible key layouts.

(1. Size it Configures Such that or Number of Sensors)

In the operational member 10, a plurality of types of keys having different sizes is disposed. As shown in FIG. 2, respective keys (the key areas 10a) are not always arrayed regularly. According to the present embodiment, the number or the arrangement of the sensors is selected depending on the size and the shape of the keys.

FIGS. 15A to 15H each shows an example of a sensor arrangement on one key area 10a. In the description below, each dashed line represents the size of the key area 10a (the key size), and each hatching represents a sensor area (a sensor S area). Here, respective sensor areas correspond to the capacitive elements C1 to C4 that are explained referring to FIG. 14, for example, and correspond to the crossing regions of the electrode groups 21w of the first electrode lines 210 and the electrode groups 22w of the second electrode lines 220 according to the present embodiment.

Figure 15A:
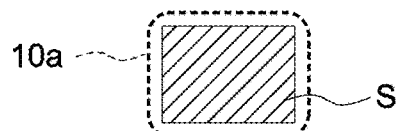
FIG. 15A is a schematic diagram illustrating a relationship between a key area and a sensor area corresponding to the key area in the input apparatus.
Figure 15B:
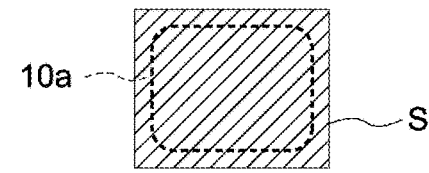
FIG. 15B is a schematic diagram illustrating a relationship between a key area and a sensor area corresponding to the key area in the input apparatus.

FIG. 15A and FIG. 15B each shows an example that one sensor S is allocated to one key area 10a. In this case, the sensor area may be smaller than the key area 10a as shown in FIG. 15A, or may be greater than the key area 10a as shown in FIG. 15B. In the following description (FIGS. 15C to 15H), the sensor area is smaller than the key area as an example, but it is not limited thereto. A magnitude relationship between the key area and the sensor area can be freely selected.

Figure 15C:
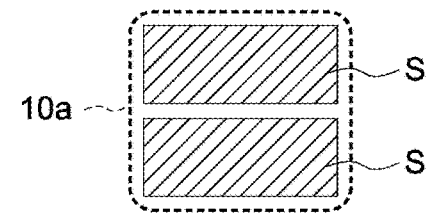
FIG. 15C is a schematic diagram illustrating a relationship between a key area and a sensor area corresponding to the key area in the input apparatus.

FIGS. 15C, 15D and 15E each shows an example that a plurality of the sensors is allocated to one key area 10a. FIG. 15C shows an example that two sensors S are disposed longitudinally. FIG. 15D shows an example that two sensors S are disposed horizontally. FIG. 15E shows an example that four sensors S are disposed vertically and horizontally in a matrix.

Figure 15H:
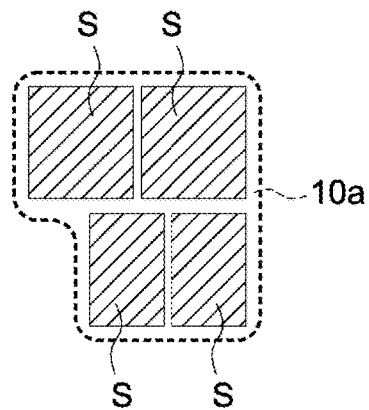
FIG. 15H is a schematic diagram illustrating a relationship between a key area and a sensor area corresponding to the key area in the input apparatus.

The number, the shape, the size or the like of the sensor(s) is not limited to those described above, and can be selected depending on the shape, the size or the like of the key areas 10a, as appropriate. A plurality of the sensors may have the same shape or size, or may have different shapes or sizes. For example, FIG. 15F shows an example that eight sensors 8 are allocated to a horizontally long key area such as a space key. FIG. 15G shows an example that five sensors S are allocated to an atypical shaped key areas such as a return key. FIG. 15H shows an example that four sensors S are allocated to an atypical shaped key areas such as a return key.

As described above, according to the present embodiment, the sensors are allocated effectively depending on the arrangement or the shape of the key. In other words, in a typical coordinate input sensor, each sensor is disposed at a regular pitch in a matrix. In contrast, according to the present embodiment, the position or the size of the sensors is changed corresponding to a key input area. Thus, the key input can be determined by fewer sensors.

(2. Sensor Sheet)

The electrode substrate 20 and the support 30 configure the sensor sheet 40 according to the embodiment. As described above, according to the present embodiment, the sensor sheet 40 can be commonly applied to a plurality types of the operational members having different key layouts. Hereinbelow, configurations of such a sensor sheet will be described.

Figure 16A:
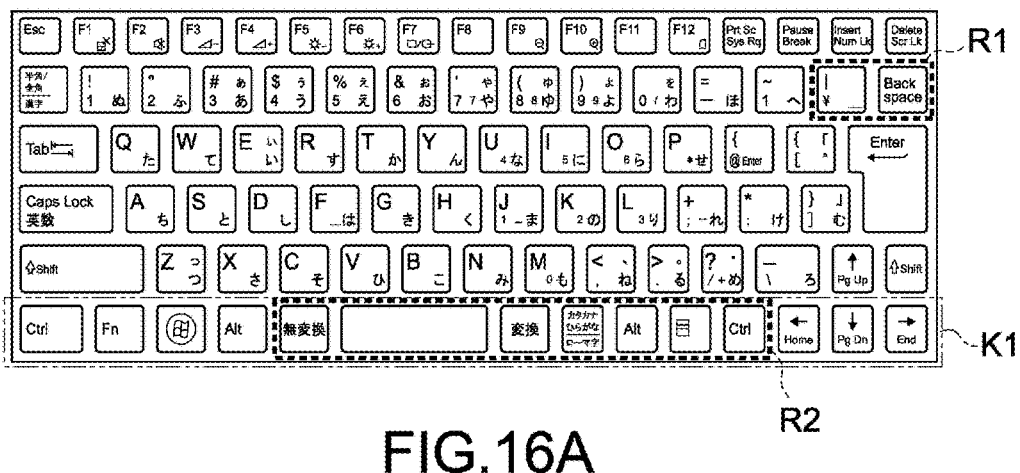
FIG. 16A is a plan view of an operational member illustrating a key layout of the input apparatus.
Figure 16B:
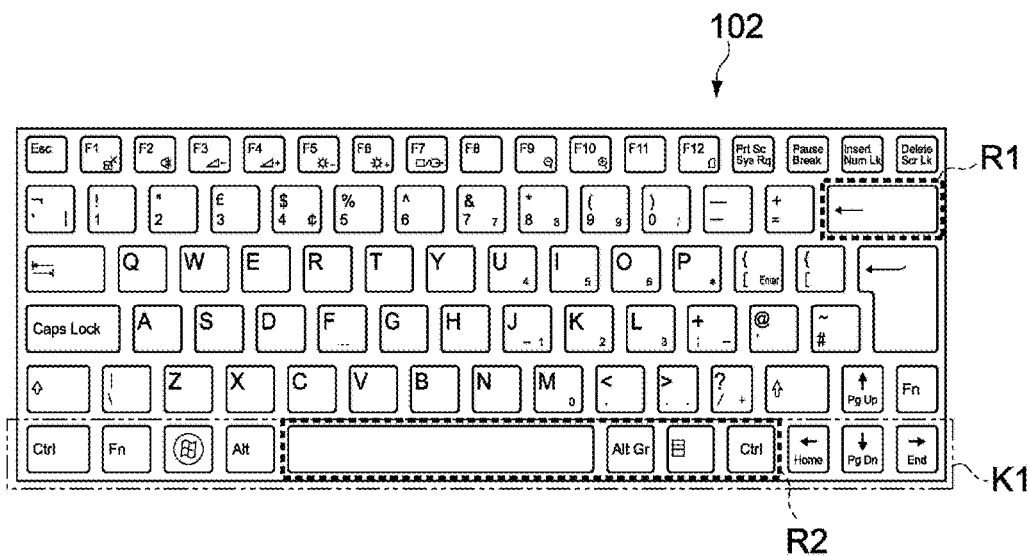
FIG. 16B is a plan view of an operational member having a key layout being different from that shown in FIG. 16A.

FIGS. 16A and 16B show two different operational members 101 and 102 having different key layouts. The operational member 101 shown in FIG. 16A has the same layout as the operational member 10 shown in FIG. 2.

As shown in FIGS. 16A and 16B, most of the both layouts have the same positions and shapes, but key groups within areas R1 and R2 enclosed by doted lines have different sizes and numbers. Such differences are induced by differences in the regions, the languages and the customs where the input apparatus is used. In general, in the input apparatus, switches or sensor parts for determining the key input are separately produced along with key top parts in order to accommodate the difference.

By the input apparatus according to the present embodiment, such a slight difference can be detected with one type of the sensor sheet. For this purpose, the sensor sheet 40 according to the present embodiment has the following configurations.

(2-1) The number, the size and the position of the sensor are set in the area having different key arrangements (2-2) In the area where several types of the key layouts are possible in the support 30, no structures (the second structure sections 320y) are disposed between the keys.

(2-3) As to the area having different key arrangements, individual criteria for determination are applied to key determination using capacitance change data provided from each sensor.

(2-4) To the input apparatus having the different key arrangements, different softwares are applied for the key determination.

(2-1. Sensor Arrangement)

Figure 17A:
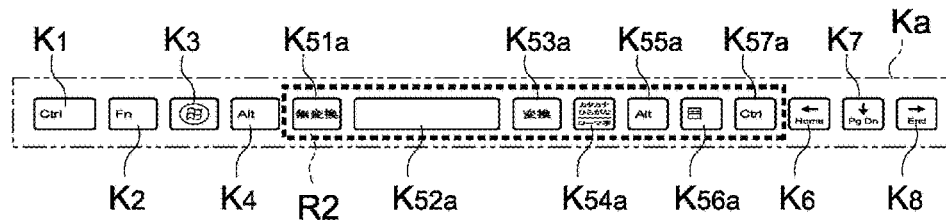
FIG. 17A is a plan view showing a bottommost key arrangement in the key layout shown in FIG. 16A.
Figure 17B:
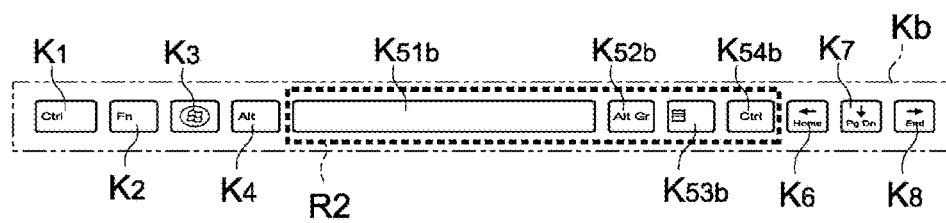
FIG. 17B is a plan view showing a bottommost key arrangement in the key layout shown in FIG. 16B.
Figure 17C:
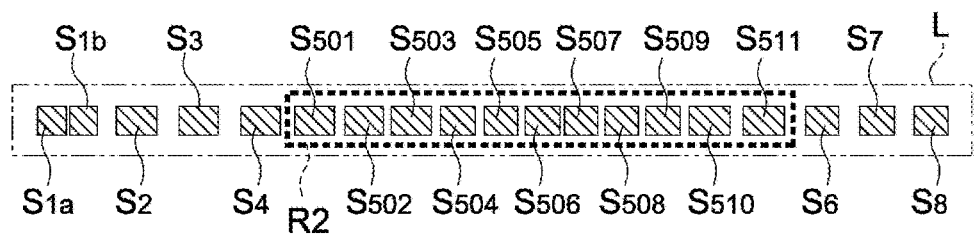
FIG. 17C is a plan view showing a bottommost key arrangement in the key layout shown in FIG. 16A or 16B.
Figure 17D:
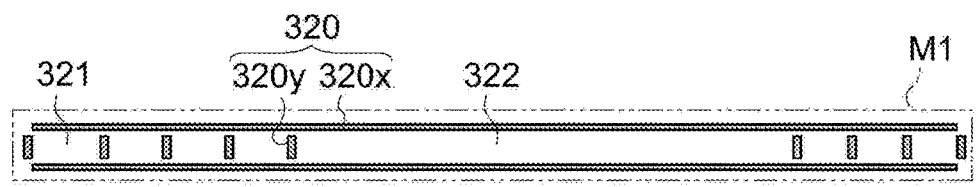
FIG. 17D is a plan view of the support showing an area corresponding to the key arrangement shown in FIG. 16A or 16B.

The sensor arrangement about the number, the size and the position of the sensor will be explained referring to FIGS. 17A to 17E. FIG. 17A shows a key arrangement Ka at a bottommost of one operational member 101. FIG. 17B shows a key arrangement Kb at a bottommost of the other operational member 102. FIG. 17C shows a sensor arrangement L of the electrode substrate 20 corresponding to the key arrangements Ka and Kb. FIG. 17D shows the arrangement M1 of the structure sections of the support 30 corresponding to the key arrangements Ka and Kb.

When the key arrangement Ka is compared with the key arrangement Kb, keys K1, K2, K3, K4, K6, K7 and K8 are common. Sensors Sa1 and S1b detect an input of the key K1, and sensors S2, S3, S4, S6, S7 and S8 each detects an input of each of the keys K2, K3, K4, K6, K7 and K8. The sensors S1a and S1b are commonly disposed on the first concave parts 321 of the arrangement M1 of the structure sections corresponding to the key K1, and the sensors S2, S3, S4, S6, S7 and S8 are commonly disposed on the first concave parts 321 of the arrangement M1 of the structure sections corresponding to the keys K2, K3, K4, K6, K7 and K8, respectively.

On the other hand, the key arrangement Ka has keys K51a, K52a, K53a, K54a, K55a, K56a and K57a within an area R2, and the key arrangement Kb has keys K51b, K52b, K53b and K54b within the area R2. Thus, in the two key arrangements Ka and Kb, the layouts of the key groups disposed within the area R2 are different.

In contrast, the sensor arrangement L has sensor groups composed of sensors (S501, S502, S503, S504, S505, S506, S507, S508, S509, S510 and S511) within the area R2 more than the keys of the key group. The sensor groups can detect an input of each key of the two key groups. Specifically, each sensor is not disposed corresponding to the key layout of the key group, and is disposed at a pitch different from the key layout. A detection method is not especially limited. Typically, the key input is determined by a coordinate calculation described later.

The number of the sensor groups is not especially limited, may be 11 (according to the present embodiment) or more or less, and can be selected depending on the number and the shape of the key within the area R2. The size and the shape of each sensor of the sensor groups may be the same. The sensor may have an atypical shape. In addition, the arrangement pitches of the respective sensors are not limited to the same, and can be changed depending on the key layout to be intended as appropriate.

(2-2. Support Configuration)

As described above, the predetermined sensor groups (S501 to S511) in the sensor arrangement L are used for the input determination of each key positioned at the area R2 of the key arrangements Ka and Kb. Since the key arrangements Ka and the Kb have the different key layouts in the areas R2, the sensor groups (S501 to S511) are commonly disposed on the second concave parts 322 of the arrangement M1 of the structure sections corresponding to the area R2.

As described above, the sensor groups (S501 to S511) are disposed on the position corresponding to the second concave parts 322. It is therefore possible to arrange the sensors S501 to S511 without interposing the second structures 320y among the sensors S501 to S511. In the arrangement M1 of the structure sections, the second structures 320y are not disposed on the position corresponding to the area R2. It is thus possible to increase freedom of the key layout within the area R2 and to provide input operability of each key with certainty.

As described above, the support 30 according to the present embodiment has the second concave parts 322 in the area where several key layouts are possible, and can be commonly used in the key layouts. Not only the support 30, but also the sensor sheet 40 composed of the electrode substrate 20 and the support 30 laminated thereon can be commonly used in a plurality of the operational members having the different key layouts.

Figure 17E:
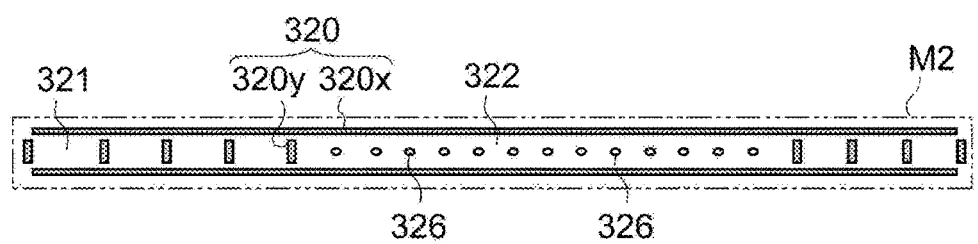
FIG. 17E is a view showing an alternative embodiment of the configuration shown in FIG. 17D.

FIG. 17E shows an alternative embodiment of the configuration of the arrangement M1 of the structure sections shown in FIG. 17D. An arrangement M2 of the structure sections shown in FIG. 17E has a configuration where the regulator units 326 described referring to FIG. 11B are disposed on the second concave parts 322. When the keys within the area R2 are input-operated, the operational member 10 facing to the second concave parts 322 may be deformed over a wide range. Then, by disposing one or more of the regulator units 326 at the predetermined places at the second concave parts 322, a large deformation of the operational member 10 over a wide range can be prevented.

(2-3. Key Determination Method)

Then, a determination method of each key input will be described. The key input is determined at the control unit 50.

The input apparatus 1 according to the present embodiment not only turns on a switch being touched, but also can turn on the switch by detecting a value of the amount of the capacitance change depending on the predetermined operational force.

For example, as to the keys disposed above the first concave parts 321 (the first spaces 331), the positions of each key and each sensor mutually coincide. For example, when one sensor corresponds to one key like the sensor S2 and the key K2, it is detected that the switch is turned on, once the amount of the capacitance change of the sensor S2 exceeds the predetermined amount by a push operation of the key K2.

Figure 18:
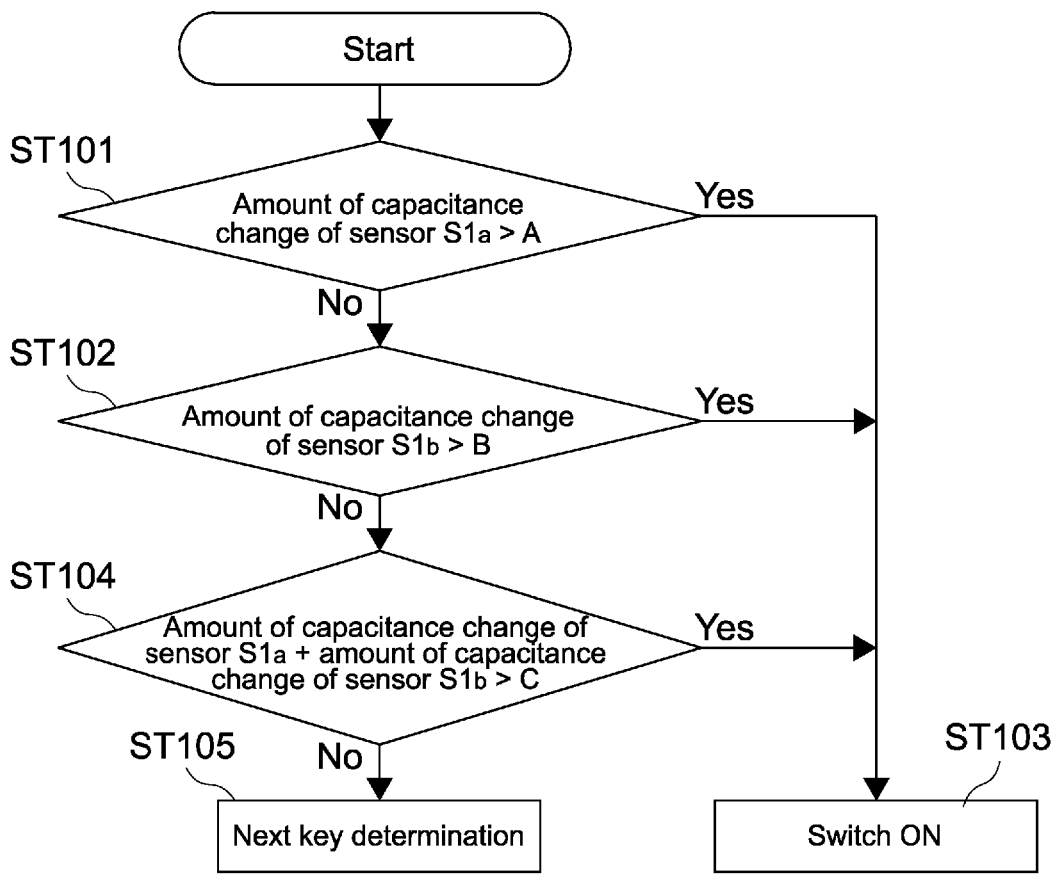
FIG. 18 is a flow chart illustrating an operation of the input apparatus.

When two sensors correspond to one key like the relationship between the sensors S1a and S1b and the key K1, it is detected that the switch is turned on, once the amount of the capacitance change of one of the sensors S1a and S1b exceeds the predetermined amount by a push operation of the key K1. For example, as shown in FIG. 18, when the amount of the capacitance change of the sensor S1a exceeds a predetermined amount A (step 101) or when the amount of the capacitance change of the sensor S1b exceeds a predetermined amount B (step 102), it is determined that the switch is turned on (step 103). In this case, the condition that the switch is turned on when a combined value of the amounts of the capacitance change of the sensor sS1a and S1b exceeds a predetermined value C (steps 104 and 103) may be added. After the key input is determined, next key input is determined (step 105).

On the other hand, as to the keys disposed above the second concave parts 322 (the second spaces 332) (the key groups arranged in the area R2), the positions of each key (K51a to K57a or K51b to K54b) and each sensor (S501 to S511) not necessarily coincide. A key determination method in this case will be described.

(Determination Method 1)

Figure 19:
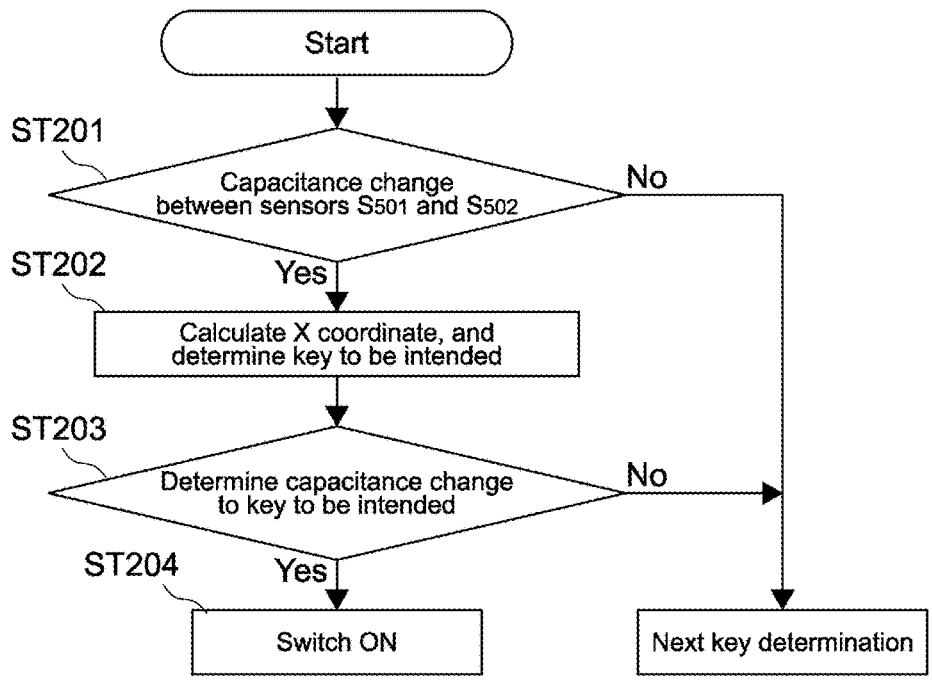
FIG. 19 is a flow chart illustrating an operation of the input apparatus.
Figure 20:
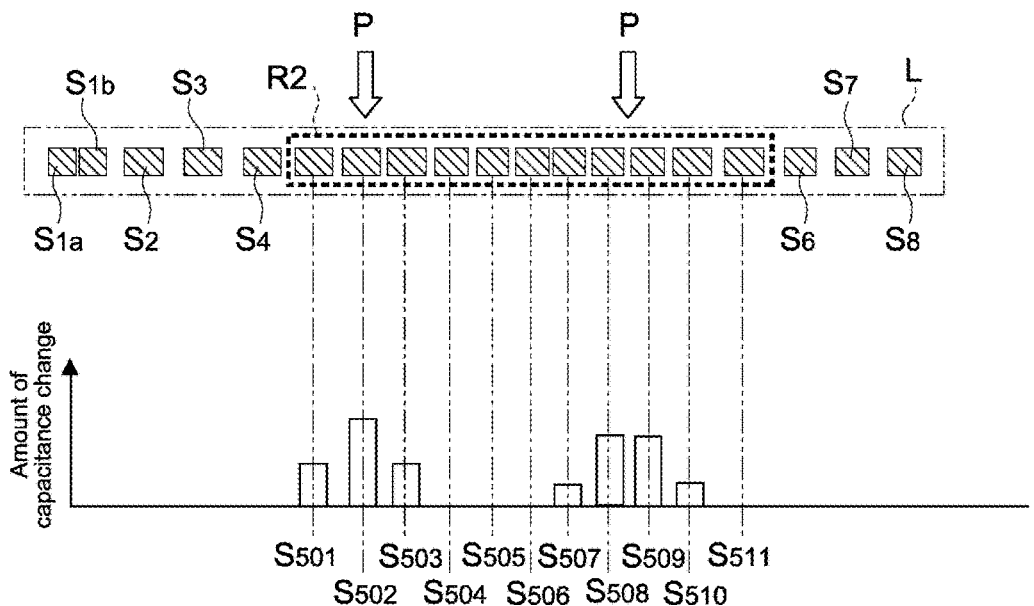
FIG. 20 is a view illustrating an operation of the input apparatus.

Typically, the key can be determined using a coordinate centroid calculation method. By the method, a coordinate to which the operability is added is calculated based on the capacitance change between the sensors (S501 to S511) to select the key for determination from a positional relationship between a coordinate position and the key arrangement, for example as shown in FIG. 19 (steps 201 and 202). Then, it is determined that the selected key is turned on when the amount of the capacitance change of each sensor or the combined value of the amount of the capacitance change of each sensor exceeds a predetermined value (steps 203 and 204). FIG. 20 shows an example of the capacitance change of each sensor S501 to S511 when an operational force P is added to the key positioned directly above the sensor S502 and the key positioned directly above between the sensor S508 and S509 at the same time.

Figure 21:
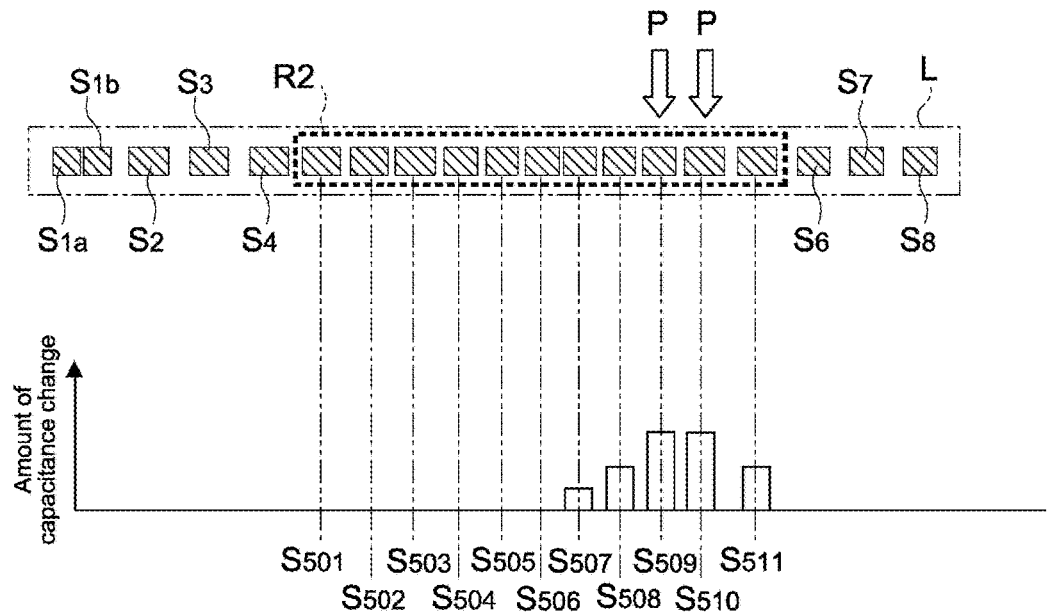
FIG. 21 is a view illustrating an operation of the input apparatus.

FIG. 21 shows an example of the capacitance change when the two keys adjacent are pressed. FIG. 21 shows the capacitance change of each sensor S501 to S511 when the operational force P is added to the key positioned directly above the sensor S509 and the key positioned directly above the sensor S510 at the same time. In this case, as the number of successive sensors where the capacitance is changed increases, it may be determined that the two keys adjacent are pressed using the combined value of the number of the sensors and the capacitance change.

(Determination Method 2)

Figure 22:
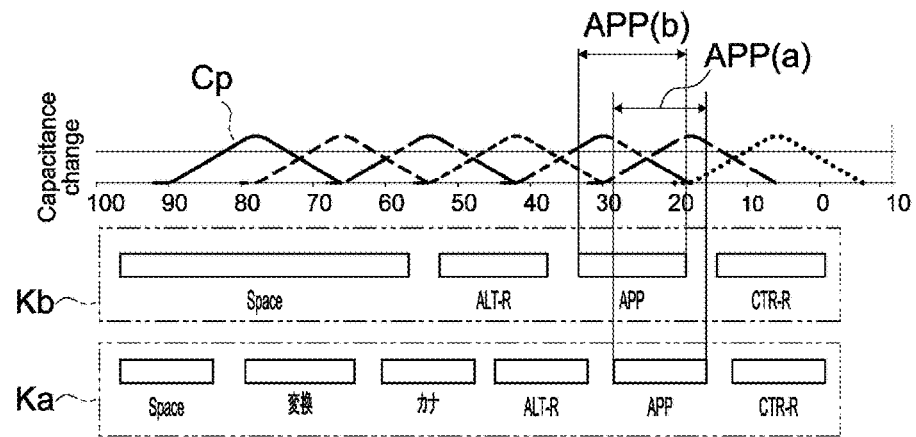
FIG. 22 is a view illustrating an operation of the input apparatus.

Instead of the coordinate centroid calculation, using the capacitance change data of each sensor, a pattern showing which key is pressed is extracted, and a switch corresponding to the pattern may be determined. FIG. 22 shows a determination logic of the switch.

Figure 23:
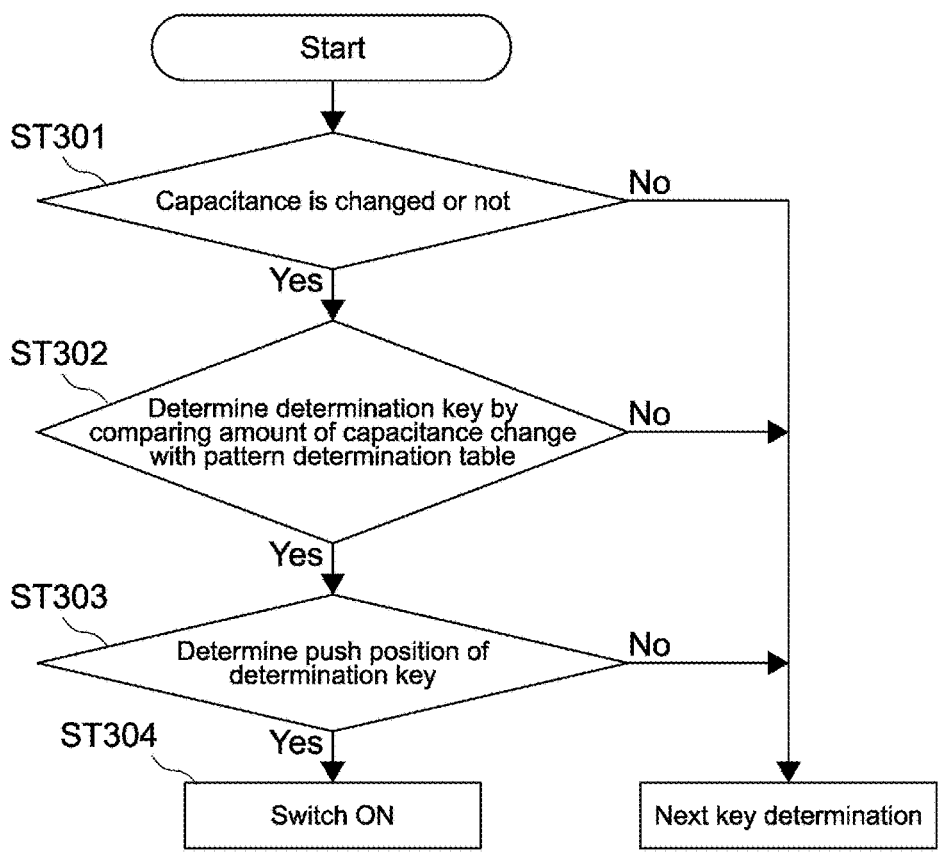
FIG. 23 is a flow chart illustrating an operation of the input apparatus.

FIG. 22 shows the two key arrangements Ka and Kb having different key layouts, and a capacitance change curve Cp of a plurality of the sensors corresponding to an operational position. In FIG. 22, "APP(a)" represents a capacitance change pattern when an "APP" key in the key arrangement Ka is inputted, and "APP(b)" represents a capacitance change pattern when an "APP" key in the key arrangement Kb is inputted. FIG. 23 shows an example of a control flow of the determination logic thereof.

Firstly, when the capacitance change of each sensor is induced by any operation (step 301), a specific pattern is classified from a table stored in the control unit 50 based on predefined determination criteria from the value of the capacitance change of each sensor (step 302). Once the pattern is classified, by the key coordinate calculation set per the pattern, it is determined whether or not the key area to be determined is pressed (step 303), and if it is within the key range set per the pattern, it is determined that the switch is turned on (step 304).

This method has an advantage that the pattern to a pressed state can be arbitrarily set as compared with the coordinate calculation by the determination method 1, and allows the determination criteria to be easily adjusted when each key determination is weighted, a plurality of the keys are pressed at the same time, or the like. In addition, it is possible that the pattern is added and a specific determination criterion is set on the pattern.

As to the difference in the key layout, a coordinate value range for the key determination may be changed by the calculated coordinate value as the coordinate of the key is different depending on the type in the case of the determination method 1, and a condition value of the pattern classification may be changed in the case of the determination method 2.

(Others)

Figure 24:
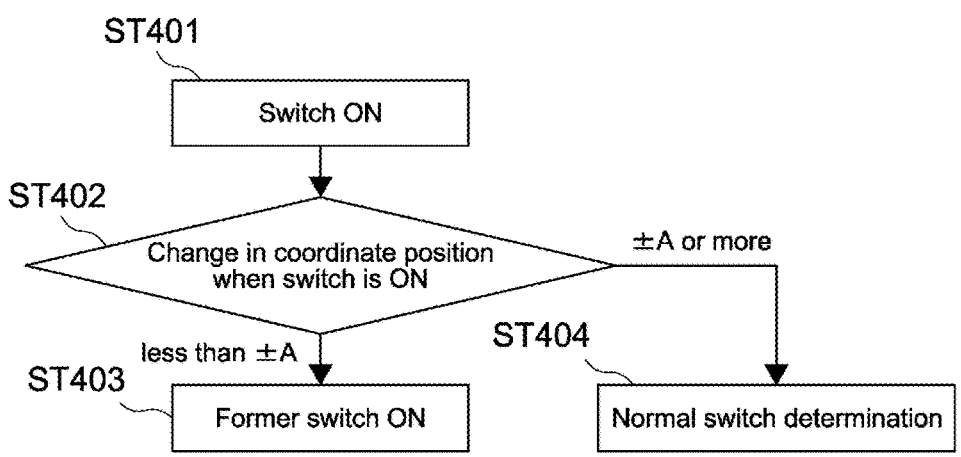
FIG. 24 is a flow chart illustrating an operation of the input apparatus.

For example, when an area between the keys adjacent vertically is pressed, a phenomenon that the keys are switched on alternately by a pressed force or a slight finger movement (chattering) occurs. Such a phenomenon may be avoided. FIG. 24 shows a control example thereof.

For example, in the determination methods 1 and 2, after the switch is firstly turned on (step 401), if the coordinate data calculated by the amount of the capacitance change detected next does not reach the predetermined distance from the coordinate position already calculated, the switch firstly pressed is again outputted (steps 402 and 403). On the other hand, if the coordinate data exceeds the predetermined distance from the coordinate position already calculated, a normal key output determination is performed (steps 402 and 403). According to this algorithm, when the operational force is applied to the two keys adjacent, the key output firstly determined is antecedent, whereby the operation can be stable even if the above-mentioned operation is performed.

The key determination of the operational members 101 and 102 having the different key layouts in the areas R1 shown in FIGS. 16A and 16B can be made by any of the above-mentioned methods or a combination of a plurality of the methods.

(2-4. Software for Key Determination)

Figure 25:
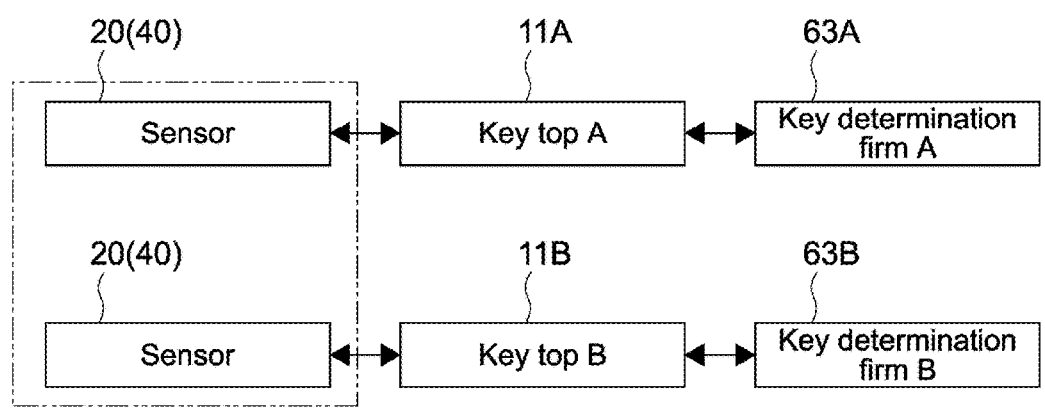
FIG. 25 is a block diagram showing an alternative embodiment of a configuration of the input apparatus.

By the above-mentioned determination methods, it is possible that a plurality types of the key layouts is provided by one type of the sensor. A plurality of the key layouts can be provided by the configuration, for example, shown in FIG. 25. In FIG. 25, the sensor part (the electrode substrate 20 or the sensor sheet 40) is common to the two key tops 11A and 11B. The key tops (operational members) 11A and 11B and key determination firms 63A and 63B are configured corresponding to the respective key layouts.

When FIG. 25 is considered as a specific device configuration, some configurations can be provided.

(Configuration Example 1 of Electronic Device)

Figure 26:
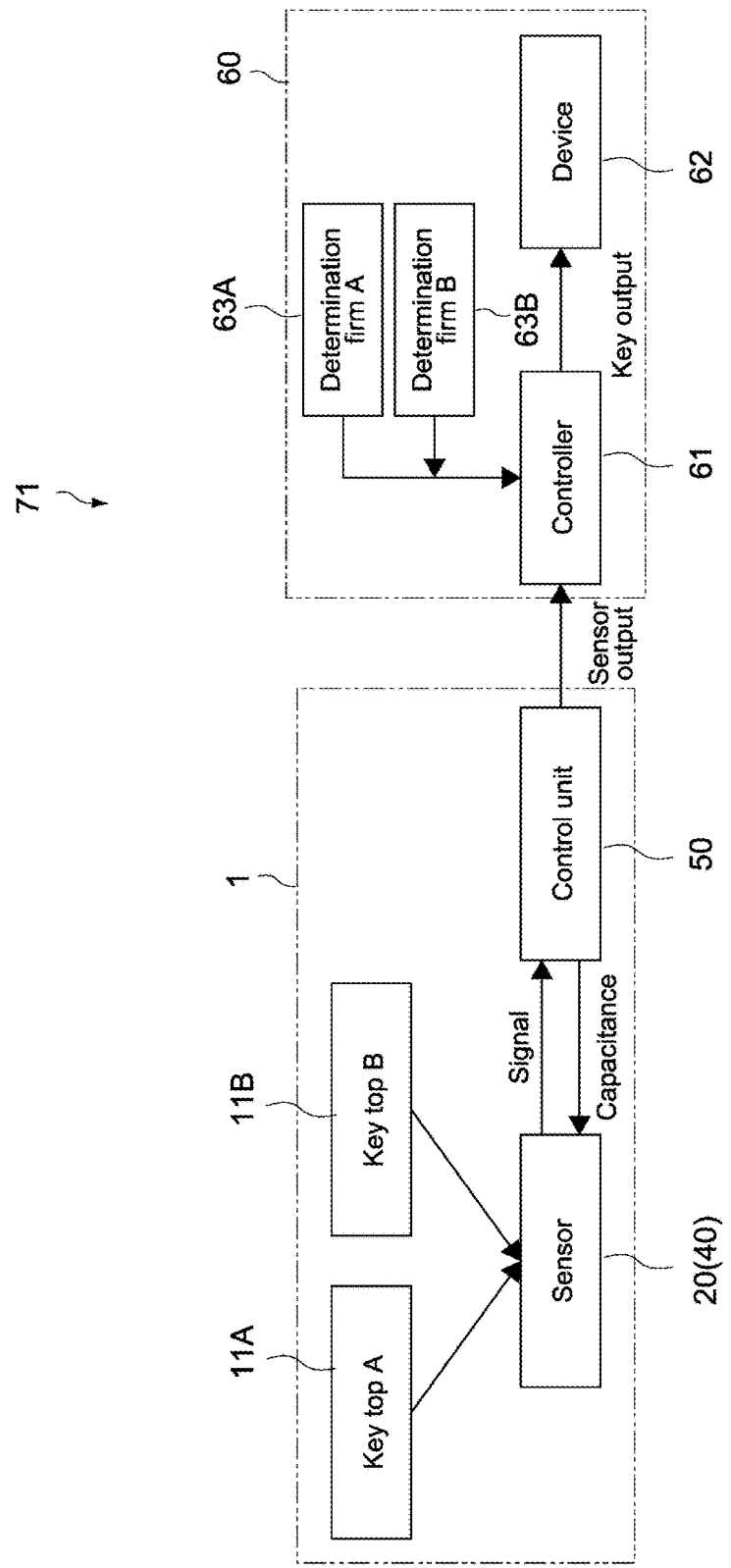
FIG. 26 is a block diagram showing a configuration of an electronic device including the input apparatus.

FIG. 26 is a block diagram showing a configuration of an electronic device 71 including the input apparatus 1. The electronic device 71 includes the input apparatus 1 and the device main unit 60. The input apparatus 1 includes the control unit 50 for detecting the capacitance change in a plurality of the detector sections 20s (sensors) on the electrode substrate 20. The device main unit 60 includes a controller 61 for receiving a sensor data signal (data signal corresponding to the amount of the capacitance change in each detector section 20s) from the control unit 50, the key determination firms 63A and 63B prepared corresponding to the key tops 11A and 11B, and a device (for example, a display) 62 to be controlled.

The device 62 is not limited to the configuration included in the device main unit 60, but may be configured independently of the device main unit 60. Also, the key determination firms 63A and 63B may be selected by the device main body 60 (for example, the controller 61) depending on the key tops 11A and 11B, or may be built in the controller 61.

In this case, all data of the sensor (the detector sections 20s) is sequentially outputted from the control unit 50 to the controller 61 regardless of the capacitance change, but only data of the sensor having the amount of the capacitance change at a predetermined value or more may be outputted. In this way, a processing burden of the controller 61 can be reduced.

(Configuration Example 2 of Electronic Device)

Figure 27:
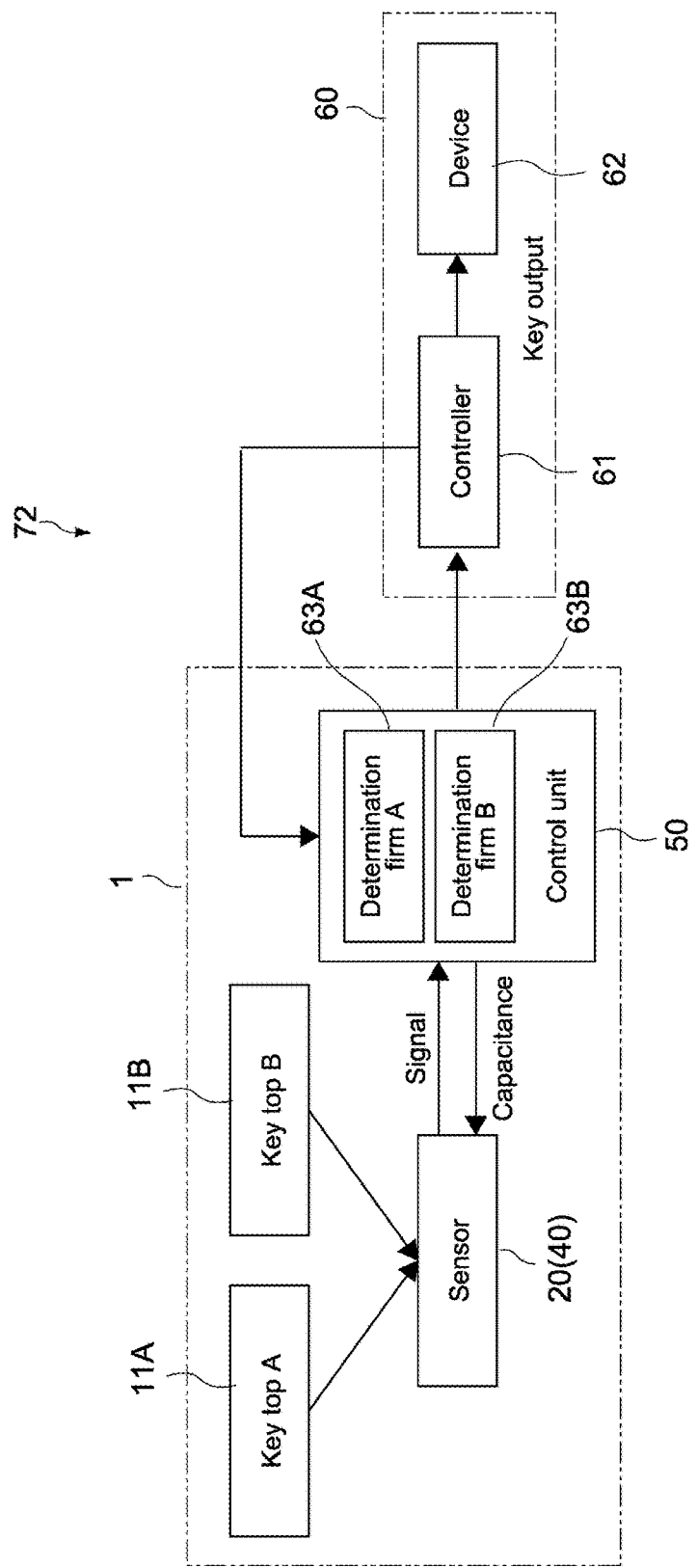
FIG. 27 is a block diagram showing a configuration of an electronic device including the input apparatus.

FIG. 27 is a block diagram showing a configuration of another electronic device 72 including the input apparatus 1. The electronic device 72 is different from the above-described electronic device 71 in that the key determination firms 63A and 63B are incorporated in the control unit 50 of the input apparatus 1. In this case, the key determination firms 63A and 63B are stored in the memory 51 of the control unit 50, firmware corresponding to the key layout is selected by a command from the device main unit 60.

Similarly, in the electronic device 72 in this embodiment, all data of the sensor (the detector sections 20s) is sequentially outputted from the control unit 50 to the controller 61 regardless of the capacitance change, but only data of the sensor having the amount of the capacitance change at a predetermined value or more may be outputted. In this way, a processing burden of the controller 61 can be reduced.

In addition, power consumption may be decreased such that the control unit 50 changes a scan interval of each detector section 20s on the electrode substrate 20 as appropriate. In this case, it can be achieved by changing a scan mode used by driving a general touch panel.

Furthermore, the input apparatus 1 according to this embodiment can perform the coordinate calculation at the operational position by a centroid calculation. In this case, by setting a mode other than a switch input mode, gesture input by fingers will be possible on the input apparatus, for example.

The input apparatus 1 can detect analogically the capacitance change in each detector section 20s. It is therefore possible to output the control signal (for example, a signal relating to a key selection display) depending on the operational force by utilizing the amount of change less than the amount of the capacitance change when the switch is turned on.

Second Embodiment

Figure 28:
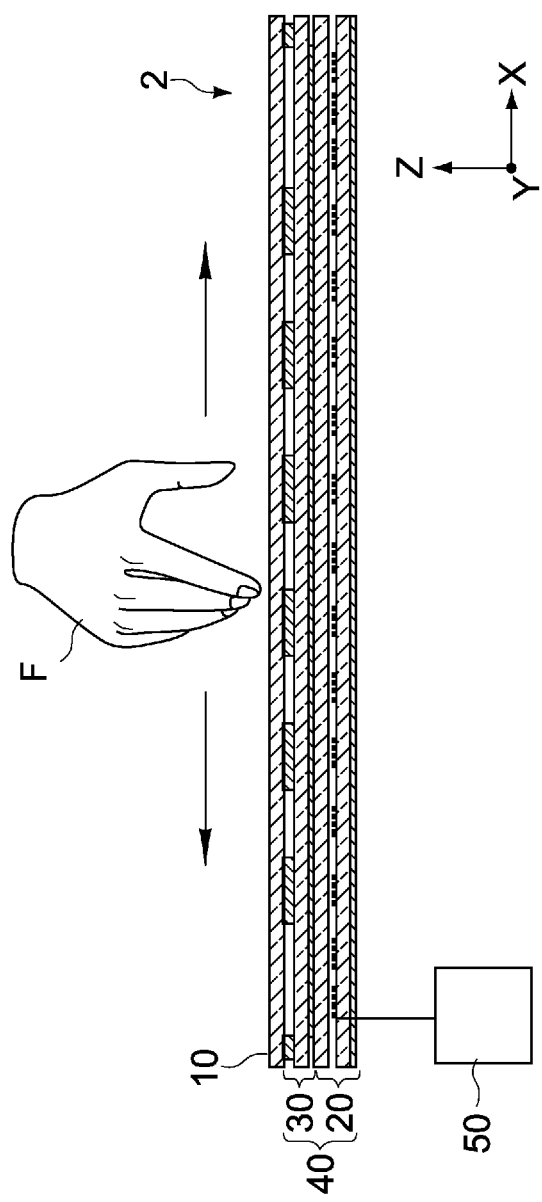
FIG. 28 is a schematic cross-sectional view of an input apparatus according to a second embodiment of the present technology.

FIG. 28 is a cross-sectional view showing a configuration of an input apparatus according to a second embodiment of the present technology. In FIG. 28, parts corresponding to those in the first embodiment are denoted by the same reference numerals, and thus detailed description thereof will be hereinafter omitted.

An input apparatus 2 according to this embodiment is different from the input apparatus 1 in that the operational member 10 includes no conductor layer 14. Thus, in the input apparatus 2, the key input can be determined such that the electrode substrate 20 electrostatically detects fingers F of a user who makes the input operation of the operational member 10.

Also, in the input apparatus 2 according to this embodiment, the control unit 50 is configured such that information about a position of an operational object (the fingers F) adjacent to the operational member 10 can be generated based on the capacitance change in a plurality of the first electrode lines 210 and a plurality of the second electrode lines 220. In this way, it is possible to detect the finger movement on the operational member 10. For example, the input apparatus 2 can be used as a pointing device.

According to the present embodiment, it is possible to detect heights of the fingers F from the operational member 10 based on the amount of the capacitance change in each detector 20s. Also, a non-contact input operation to the operational member 10 can be possible.

Also in this embodiment, the above-described alternative embodiments about the operational member 10, the electrode substrate 20, the support 30 and the control unit 50 as well as the key determination methods can be applied.

Third Embodiment

Then, a third embodiment of the present technology will be described. This embodiment is different from the first embodiment in that there is a function of illuminating the key area.

Configuration Example 1

Figure 29:
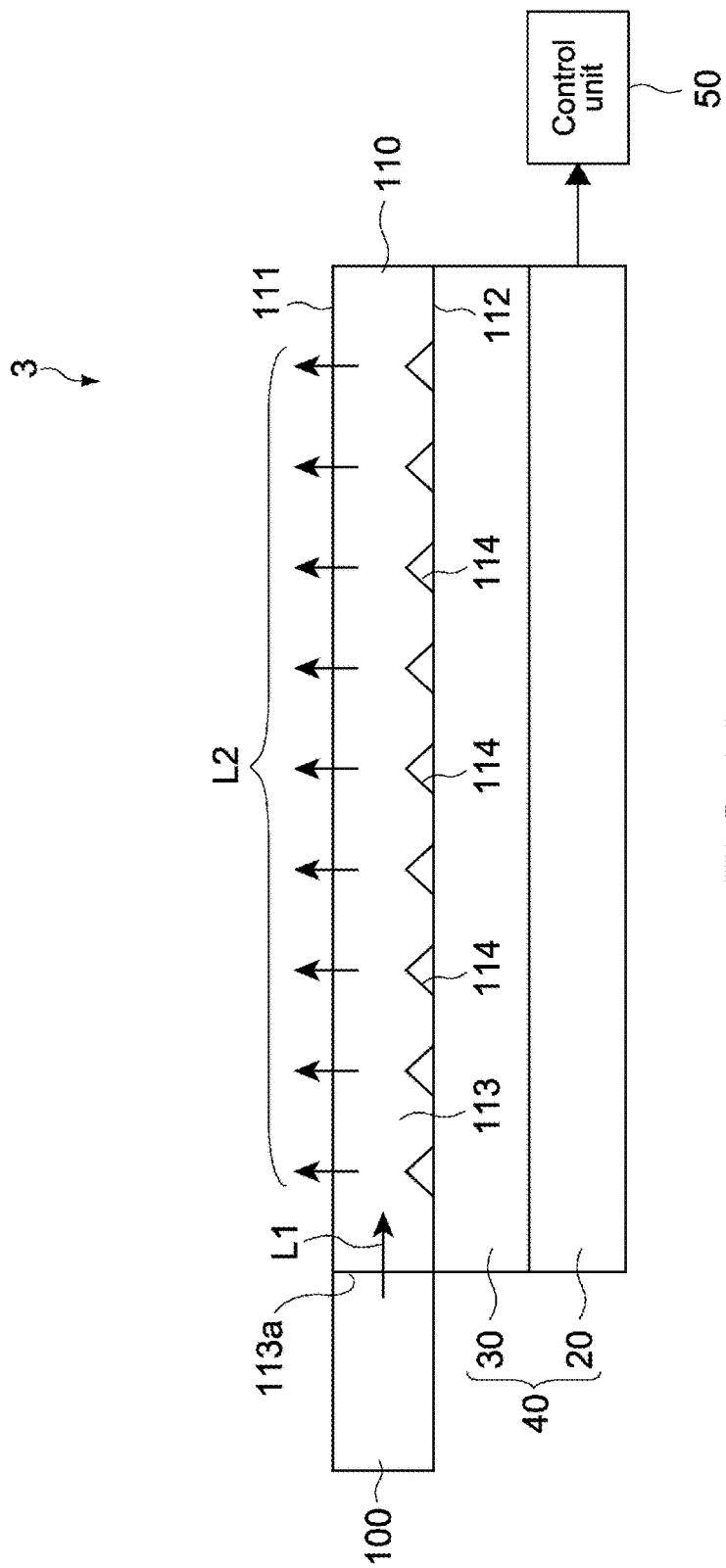
FIG. 29 is a schematic side view showing a configuration example of an input apparatus according to a third embodiment of the present technology.

FIG. 29 is a schematic side view showing a configuration example of an input apparatus according to a third embodiment of the present technology. An input apparatus 3 of this embodiment includes a light source 100 and an operational member 110. The operational member 110 of this embodiment is common to the operational member 10 of the first embodiment in that it is a sheet-like operational member that can be deformed having a plurality of the key areas, but transmits an illuminated light L1 from the light source 100 and converts it into a display light L2 that is emitted to a front direction (upwardly in FIG. 29) of the input apparatus 3.

The operational member 110 is configured as a light guide plate composed of a light transmitting material such as PET, PEN PMMA and the like that can be deformed. In other words, the operational member 110 includes a first surface 111 where the input operation is made by the user, a second surface 112 facing to the sensor sheet 40 (support 30), a light guide section 113 formed between the first surface 111 and the second surface 112, and diffuser sections 114. The diffuser sections 114 are formed on the second surface 112, and diffuse an illuminated light transmitting the light guide section 113 to a plurality of the key areas, thereby forming the display light L2 exiting from the first surface 111.

The light source 100 is disposed on a side face 113a of the light guide section 113. The illuminated light L1 incident on the side face 113a repeats total reflection between the first surface 111 and the second surface 112, proceeds to a side face at an opposite side, and exits as the display light L2 by a diffusion action at the diffuser sections 114.

As the light source 100, a dot-like light source such as an LED (Light Emitting Diode), a semiconductor laser and an organic EL lamp; a linear light source such as a CCFL (Cold Cathode Fluorescent Lamp); or the like can be used. The linear light source may be configured of a plurality of the dot-like light sources. The illumination light L1 is not especially limited as long as it is a visible light, and can be any colored light including a white light, a red light, a green light and a blue light.

The diffuser sections 114 are configured of concave/convex sections formed on the second surface 112 of the operational member 110. By configuring the diffuser sections 114 with geometric structure faces, total reflection conditions of the illuminated light L1 in forming areas of the diffuser sections 114 are destroyed, and the illuminated light L1 can be sent upward to the first surface 111 and be emitted as the display light L2.

Figure 30:
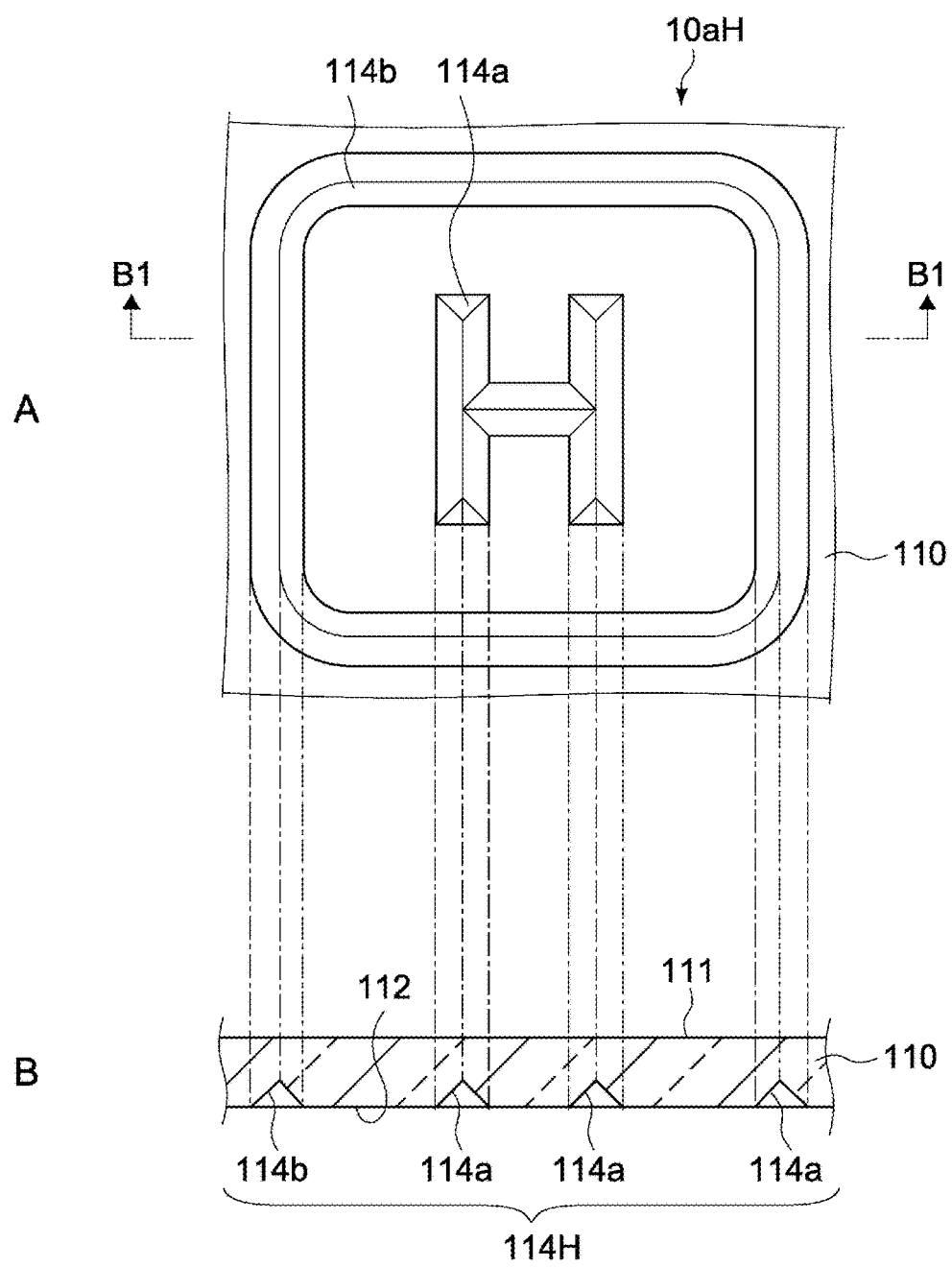
FIG. 30 shows a configuration example of a predetermined key area including parts A and B; the part A is a main part plan view and the part B is a B1-B1 line sectional view of the part A.

Typically the diffuser sections 114 are disposed on the operation member 110 where a plurality of the key areas is displayed. FIG. 30 shows a configuration example of the diffuser sections 114 for illuminating the key areas of "H".

In FIG. 30, a part A is a main part plan view showing a configuration example of the diffuser section 114H corresponding to key area 10aH displaying the "H", and a part B is a B1-B1 line sectional view of the part A. A diffuser section 114H includes first concave/convex sections 114a for displaying the key "H", and second concave/convex sections 114b for displaying ranges (contours) of the operational area 10aH. The first and second concave/convex sections 114a and 114b are configured of sectional triangle concave sections formed on the second surface 112.

Figure 31:
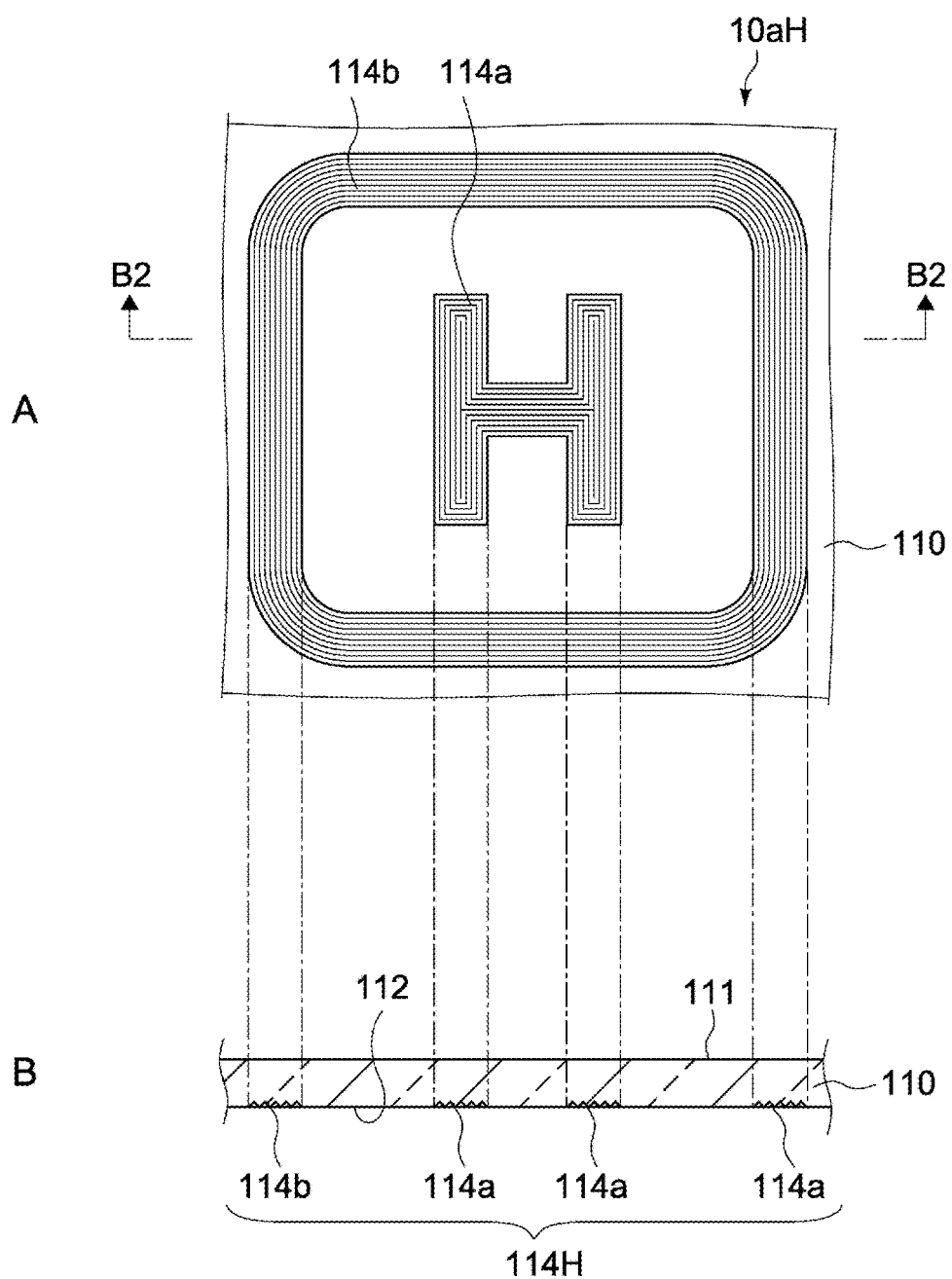
FIG. 31 shows another configuration example of the key area including parts A and B; the part A is a main part plan view, and the part B is a B2-B2 line sectional view of the part A.

In FIG. 31, a part A is a main part plan view showing another configuration example of the diffuser section 114H corresponding to key area 10aH displaying the "H", and a part B is a B2-B2 line sectional view of the part A. A plurality of the first and second concave/convex sections 114a and 114b is composed of a plurality of fine groove sections.

Figure 32:
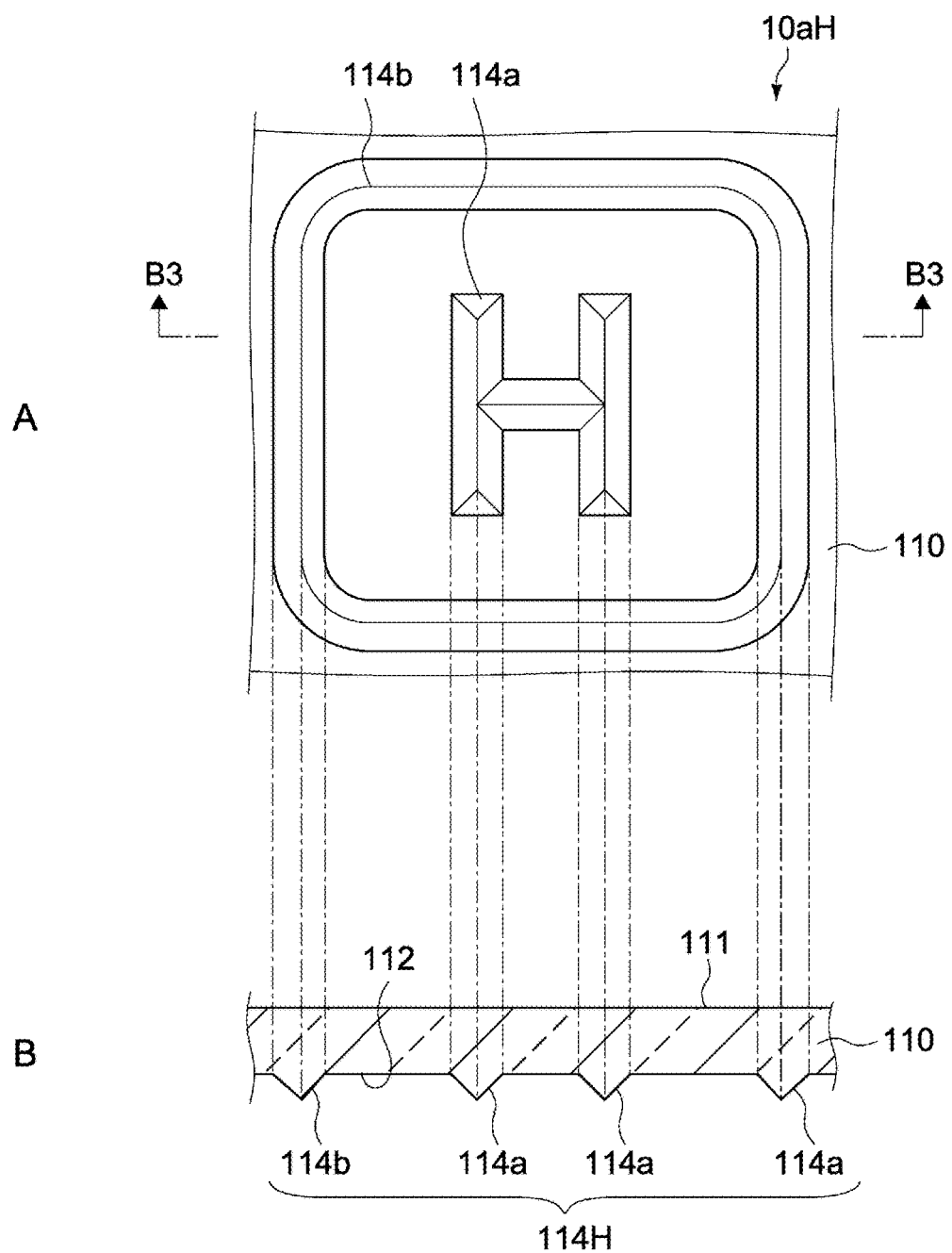
FIG. 32 shows another configuration example of the key area including parts A and B; the part A is a main part plan view, and the part B is a B3-B3 line sectional view of the part A.

In FIG. 32, a part A is a main part plan view showing another configuration example of the diffuser section 114H corresponding to the key area 10aH displaying the "H", and a part B is a B3-B3 line sectional view of the part A. According to this embodiment, the first and second concave/convex sections 114a and 114b are composed of section triangle-shaped convex sections protruded and formed on the second surface 112.

Figure 33A:
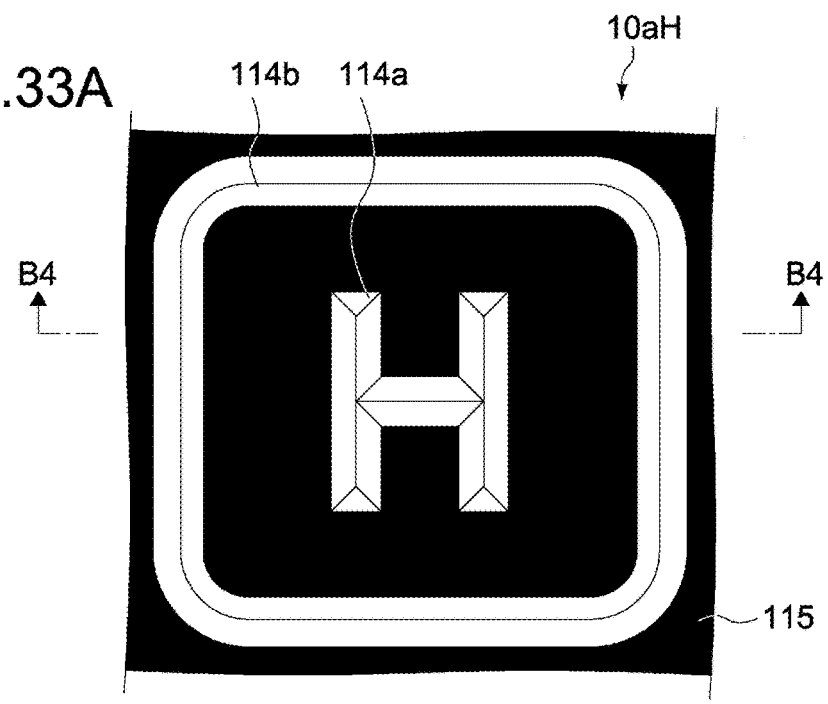
FIG. 33A is a main part plan view showing another configuration example of the key area.
Figure 33B:
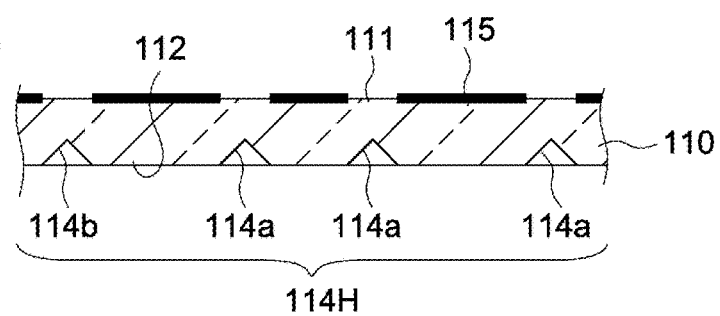
FIG. 33B is a B4-B4 line sectional view of FIG. 33A.

FIG. 33A is a main part plan view showing another configuration example of the key areas 10aH displaying the "H", and FIG. 33B is a B4-B4 line sectional view of FIG. 33A. According to this embodiment, the first and second concave/convex sections 114a and 114b are composed of section triangle-shaped convex sections, and of masks 115 for displaying as a white pattern on a colored background the key "H" on the first surface 111 of the operational member 110.

Figure 34A:
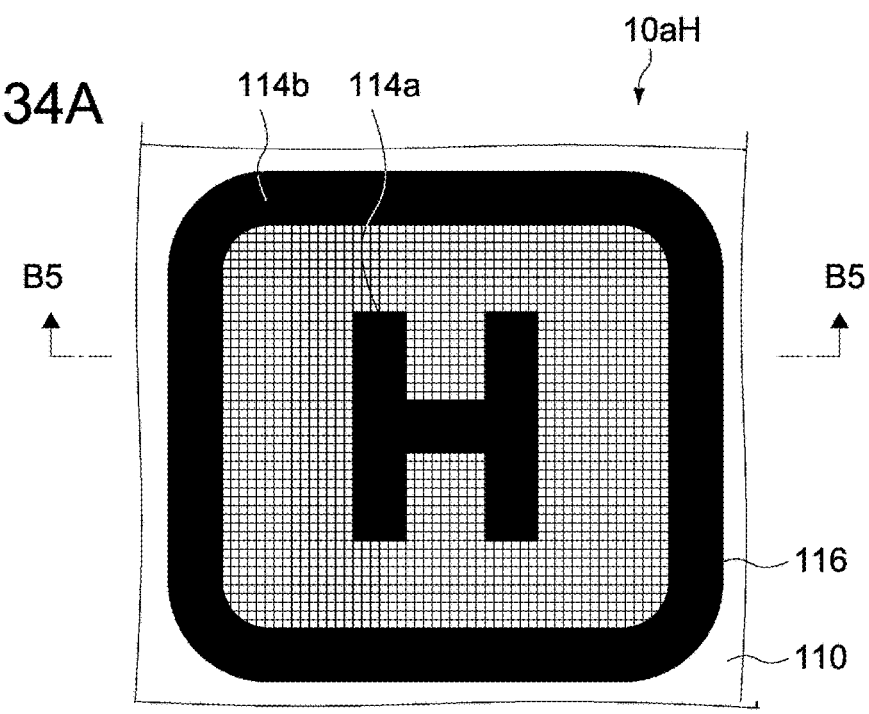
FIG. 34A is a main part plan view showing another configuration example of the key area.
Figure 34B:
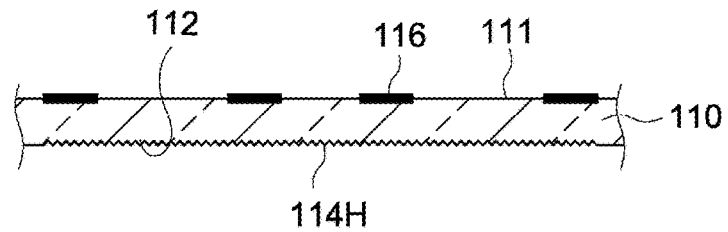
FIG. 34B is a B5-B5 line sectional view of FIG. 34A.

FIG. 34A is a main part plan view showing another configuration example of the key areas 10aH displaying the "H", and FIG. 34B is a B5-B5 line sectional view of FIG. 34A. According to this embodiment, the diffuser section 114H composed of a plurality of fine grid grooves is formed on the area corresponding to the key area 10aH on the second surface 112 of the operational member 110, and masks 116 for displaying the key "H" on the first surface 111 of the operational member 110.

Figure 35:
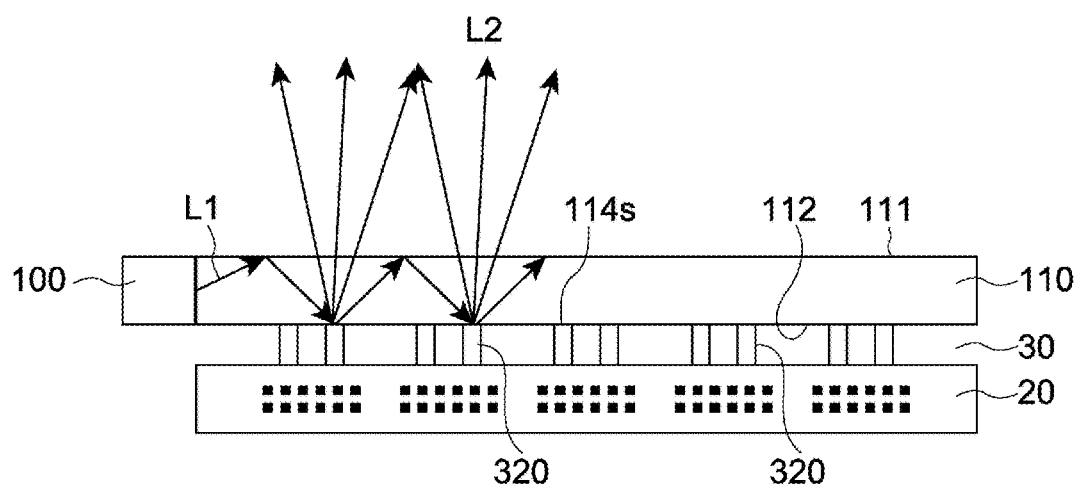
FIG. 35 is a schematic side view showing another configuration example of the input apparatus.

Furthermore, FIG. 35 is a schematic side view of the input apparatus where the diffuser sections 114s are disposed on a bonded section of the second surface 112 of the operational member 110 and a plurality of the structures 320 of the support 30. By configuring the diffuser sections 114s with optical faces having reflectance, refractive index or the like different from other areas, total reflection conditions of the illuminated light L1 are destroyed, and the illuminated light L1 can be sent upward to the first surface 111 and be emitted as the display light L2.

As described above, according to this embodiment, a plurality of the key areas 10a on the operational member 110 can emit the display light L2, whereby visibility of each key area 10a can be increased, e.g., the input operability can be provided when it is used in a dark room or outdoor.

Configuration Example 2

Figure 36:
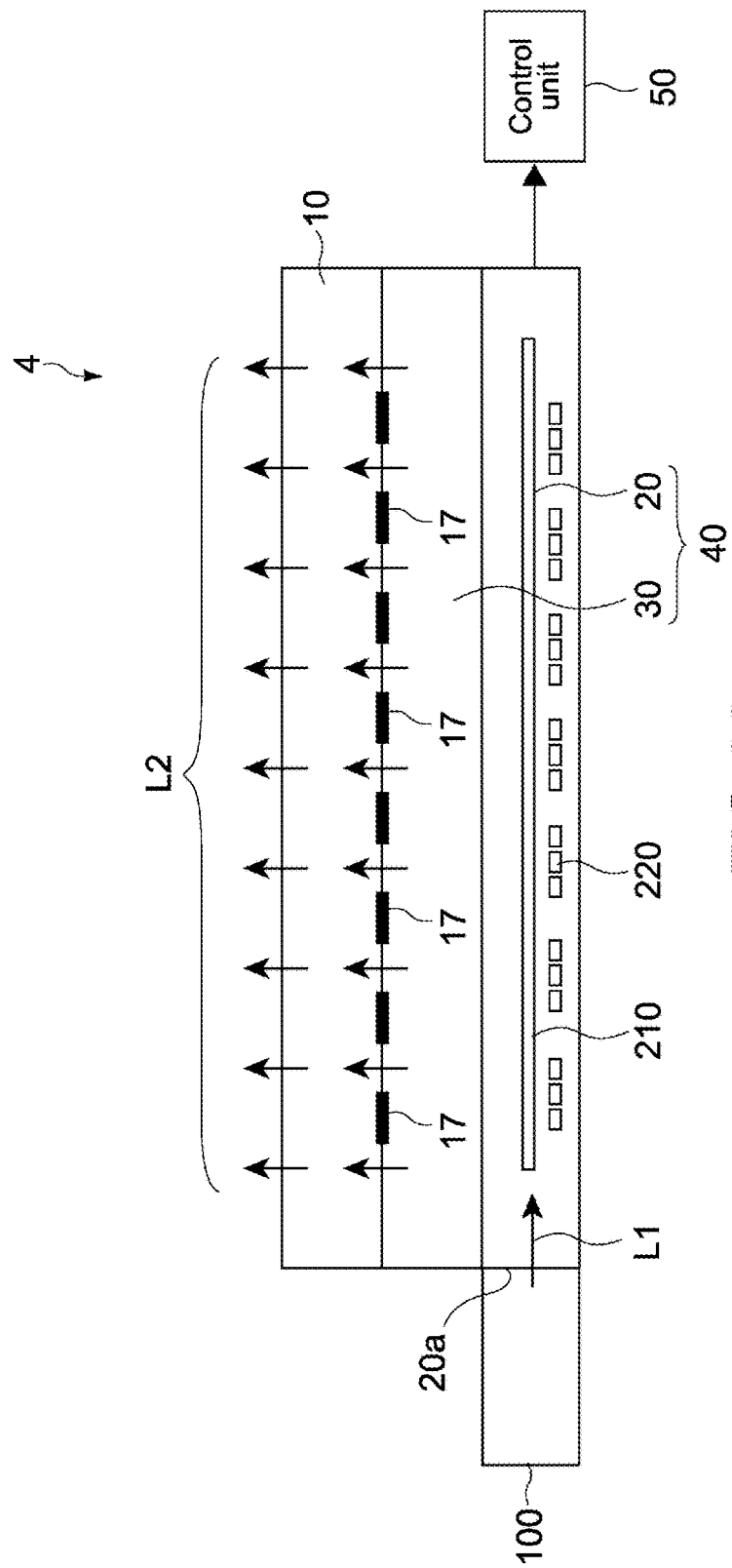
FIG. 36 is a schematic side view showing another configuration example of the input apparatus.

FIG. 36 is a schematic side view showing another configuration example of an input apparatus according to this embodiment. In an input apparatus 4 of this embodiment, the light source 100 is disposed on a side face 20a of the electrode substrate 20.

The operational member 10 is composed of a light transmitting material. The electrode substrate 20 includes a first base material 211 supporting a plurality of the first electrode lines 210 and a second base material 221 supporting a plurality of the second electrode lines 220 (FIG. 3), and the side face 20a of the electrode substrate 20 is composed of side faces of these first and second substrates 221 and 222 and the bonding layer 23 bonding them, as described in the first embodiment. In this case, the first and second substrates 221 and 222 and the bonding layer 23 are composed of the light transmitting material.

The first and second electrode lines 210 and 220 can function as a diffuser layer that reflects and diffuses the illuminated light L1 to the operation member 10. The first and second electrode lines 210 and 220 may be composed of a non-light transmitting material such as an Ag paste or a light transmitting conductor oxide material such as ITO.

On the other hand, a plurality of the structures 320 in the support 30 may be function as the diffuser layer that reflects and diffuses the illuminated light L1 to the operation member 10. In this case, a plurality of the structures 320 (FIG. 3) is composed of the light transmitting material. The conductor layer 14 (FIG. 3) disposed between the operational member 10 and the support 30 is composed of a mesh pattern or a transparent conductor film such as ITO, thereby providing light transmitting properties.

Also, as shown in FIG. 36, mask layers 17 for defining a transmitting area of the display light L2 may be formed between the support 30 and the operational member 10. This allows only a plurality of the key areas 10a to emit light, for example. The mask layers 17 are formed at a lower face of the operational member 10, but may be formed on an upper face of the operational member 10. Alternatively, the mask layers 17 may be formed by patterning the conductor layer 14 (FIG. 3).

Configuration Example 3

Figure 37:
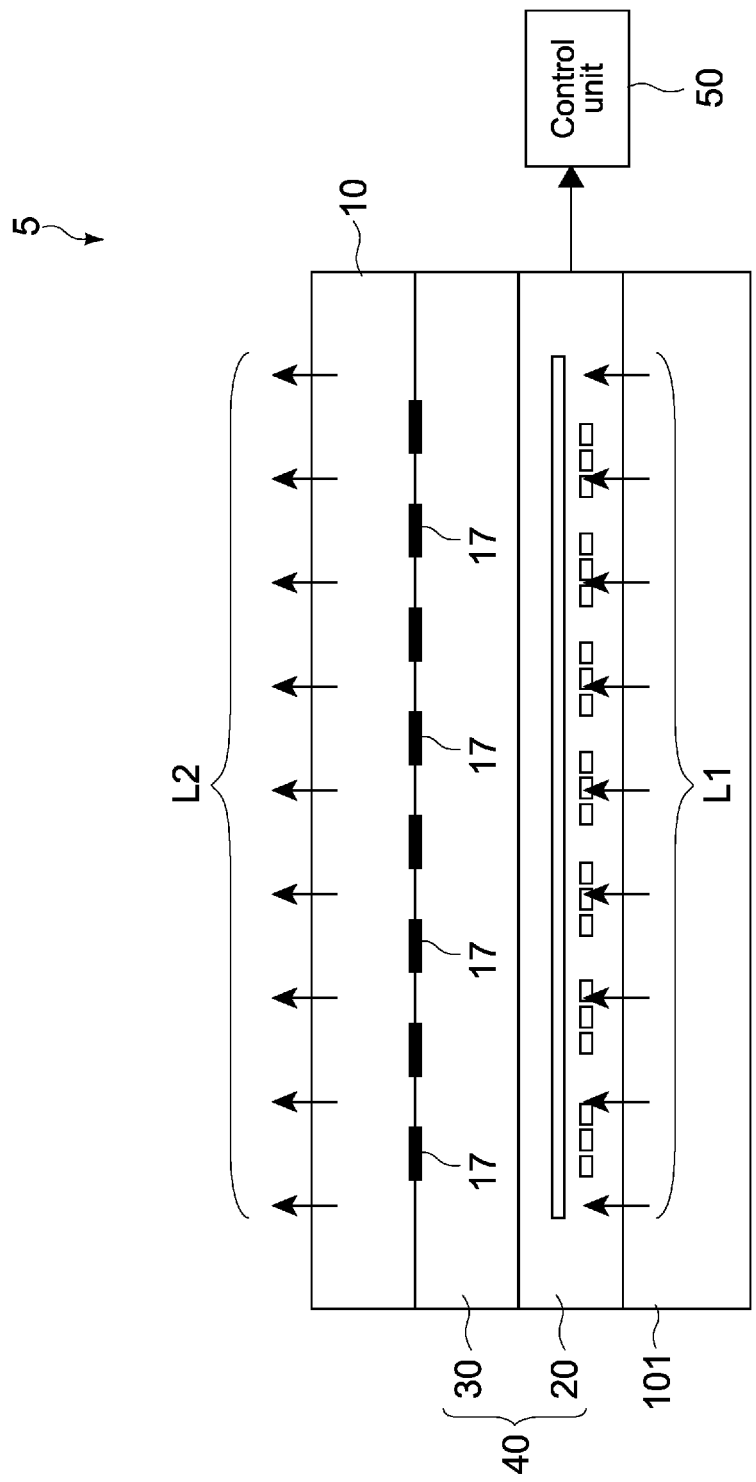
FIG. 37 is a schematic side view showing another configuration example of the input apparatus.

FIG. 37 is a schematic side view showing another configuration example of an input apparatus according to this embodiment. In an input apparatus 5 of this embodiment, a light source 101 is disposed on the back face of the electrode substrate 20.

The light source 101 is composed of a sheet-like light source. The light source 101 is configured of the sheet-like light source such as an organic EL device, but may be composed of a plurality of dot-like light sources, or a plurality of linear light sources. The light source 101 is disposed facing to the operation member 10 via the sensor sheet 40, and the illuminated light L1 is irradiated to the operational member 10 via the sensor sheet 40.

Also in this embodiment, the operational member 10, the first and second substrates 221 and 222 in the electrode substrate 20, and a plurality of structures 320 in the support 30 are composed of the light transmitting material. Also in this case, the first and second electrode lines 210 and 220 and a plurality of the structures 320 may function as the diffuser layer that reflects and diffuses the illuminated light L1. Typically, the first and second electrode lines 210 and 220 are composed of the light transmitting conductor oxide material such as ITO. In order to provide light transmittance, an adequate clearance may be disposed between the respective electrode lines 210 and 220.

Similarly as described above, the conductor layer 14 (FIG. 3) disposed between the operational member 10 and the support 30 may be composed of the mesh pattern or the transparent conductor film such as ITO. Furthermore, the mask layers 17 for defining the transmitting area of the display light L2 may be formed between the support 30 and the operational member 10.

While the present technology is described herein with reference to illustrative embodiments, it should be understood that the present technology is not limited to the above-described embodiments, and variations and modifications may be made without departing from the scope of the present technology.

For example, according to the above-described embodiments, as the sensor sheet 40 (the electrode substrate 20 and the support 30), the configuration example uses the two different operational members having the different key layouts, but is not limited thereto. Three or more operational members having mutually different key layouts may be used.

In addition, an input determination method of the keys arranged in the area where several key layouts are possible is not limited to the above-described embodiments, and other determination logics may be used to specify the input key.

According the above-described first embodiment, the sensor sheet 40 is composed of the electrode substrate 20 and the support 30. The sensor sheet may further include a second conductor layer facing to the back face of the electrode substrate 20 and a second support disposed between the second conductor layer and the electrode substrate 20. For example, the second conductor layer is connected to the ground potential, and the second support is composed of a plurality of the structures similar to a plurality of the structures 320. In this way, the electrode substrate 20 can output the capacitance change based on the change in the distance to the support 30 and the change in the distance to the second conductor layer, whereby the detection sensitivity can be improved and the detection accuracy can be enhanced.

Figure 38A:
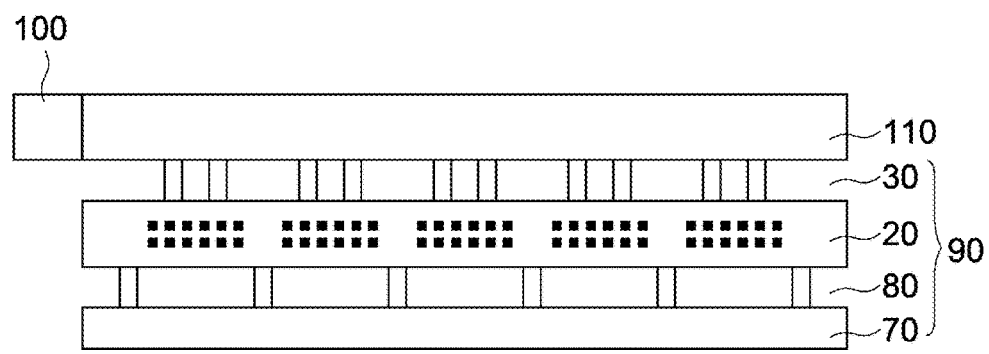
FIG. 38A is a schematic side view showing another configuration example of the input apparatus.
Figure 38B:
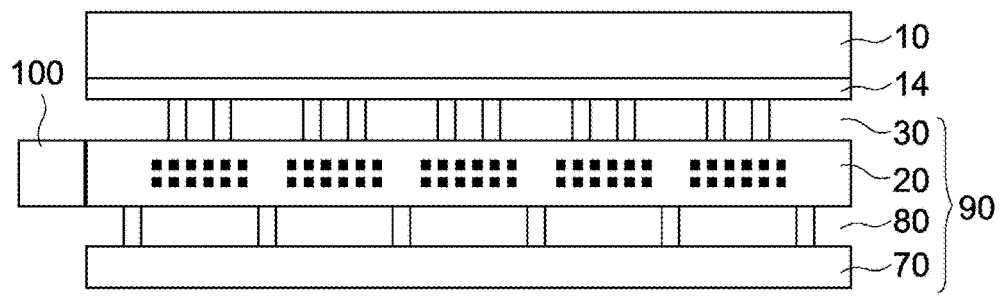
FIG. 38B is a schematic side view showing another configuration example of the input apparatus.
Figure 38C:
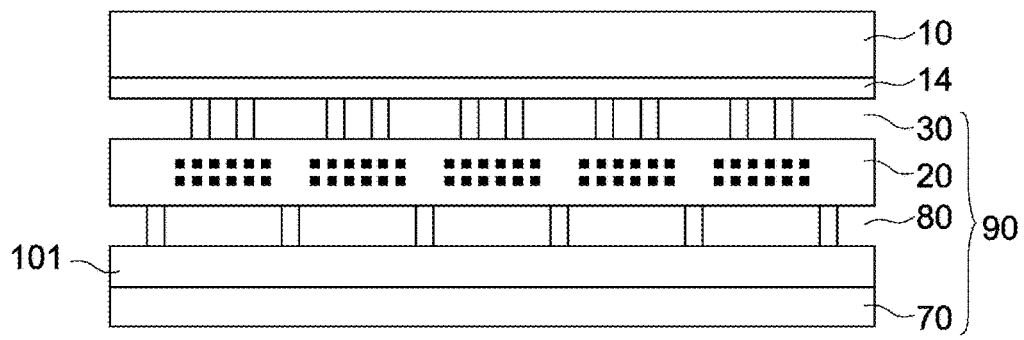
FIG. 38C is a schematic side view showing another configuration example of the input apparatus.

FIGS. 38A to 38C schematically each shows a configuration of an input apparatus including a sensor sheet 90 having the above-described configuration. The electrode substrate 20 is disposed between the first conductor layer 14 and a second conductor layer 50. The electrode substrate 20 is connected to the first conductor layer 14 (the operational member 10 or 110) via the first support 30, and to the second conductor layer 70 via a second support 80. FIGS. 38A to 38C each shows an input apparatus having the function of illuminating the key area as described in the third embodiment, but may also be configured of an input apparatus having no such function.

Here, FIGS. 38A, 38B and 38C correspond to the configuration example 1, the configuration example 2 and the configuration example 3 according to the third embodiment, respectively. In the configuration examples shown in FIGS. 38B and 38C, the second conductor layer 70 also function as reflection surfaces that reflect the illuminated light L1. In this case, the reflection surfaces may be formed of mirror surfaces (silver, aluminum or the like) or may be formed of scattering surfaces (diffusing surfaces), thereby improving light use efficiency.

According to the above-described third embodiment, the key areas are illuminated passively, but may be illuminated actively as described below.

For example, in the configuration example 1 (FIG. 29) according to the third embodiment, a diffuser section (a scattering section) may be disposed on the electrode substrate 20 corresponding to the respective key areas instead of the configuration that the diffuser section 114 is disposed on the operational member 110. In this case, the diffuser section is configured such that when the operational member 110 is deformed by an operational load and is contacted with the electrode substrate 20, the total reflection conditions of the illuminated light L1 transmitting an inside of the operation member 110 are destroyed. In this way, the illuminated light L1 can be sent upward to the first surface 111 of the operation member 110 and be emitted as the display light L2.

Also, in the configuration example 2 (FIG. 36) according to the third embodiment, the diffuser section (the scattering section) may be formed at an operational member 10 side. Also in this case, when the operational member 110 is deformed by an operational load and is contacted with the electrode substrate 20, the total reflection conditions of the illuminated light L1 passing the electrode substrate 20 are destroyed, and the illuminated light L1 can be sent upward to the first surface 111 and be emitted as the display light L2.

Furthermore, in the configuration example shown in FIG. 38B, the diffuser section (the scattering section) may be disposed on at least one of the first conductor layer 14 and the second conductor layer 70. In this case, when the first conductor layer 14 and the electrode substrate 20 are deformed by an operational load and the electrode substrate 20 is contacted with the first conductor layer 14 or the second conductor layer 70, the total reflection conditions of the illuminated light L1 passing the electrode substrate 20 are destroyed, and the illuminated light L1 can be sent upward to the first surface 111 and be emitted as the display light L2.

The present technology may have the following configurations.

(1) An input apparatus, including:

a deformable sheet-like operational member having a plurality of key areas;

an electrode substrate having a plurality of first electrode lines and a plurality of second electrode lines disposed facing to a plurality of the first electrode lines and crossing with a plurality of the first electrode lines, being capable of electrostatically detecting a change in a distance to each of a plurality of the key areas; and a support having a plurality of structures connecting the electrode substrate and the operational member, first spaces formed between a plurality of the structures corresponding to each of a plurality of the key areas, and second spaces formed between a plurality of the structures common to a predetermined plurality of the key areas.

(2) The input apparatus according to (1) above, in which the electrode substrate further has a plurality of detector sections formed at crossing regions of a plurality of the first electrode lines and a plurality of the second electrode lines, and configured such that capacitance is variable depending on a relative distance to a plurality of the key areas, and a plurality of the structures is disposed on non-crossing regions of a plurality of the first electrode lines and a plurality of the second electrode lines.

(3) The input apparatus according to (2) above, in which a plurality of the detector sections includes a predetermined plurality of the detector sections capable of detecting an input operation to a predetermined plurality of the key areas, and a predetermined plurality of the detector sections is disposed on the second spaces such that the number of a predetermined plurality of the detector sections is greater than the number of a predetermined plurality of the key areas.

(4) The input apparatus according to (2) above, in which a plurality of the detector sections have a predetermined plurality of the detector sections capable of detecting the input operation to a predetermined plurality of the key areas, and a predetermined plurality of the detector sections is disposed on the second spaces at arrangement pitches different from those of a predetermined plurality of the key areas.

(5) The input apparatus according to any one of (1) to (4) above, in which the support further has a through hole capable of communicating a plurality of the first spaces and a plurality of the second spaces with outside air.

(6) The input apparatus according to any one of (1) to (5) above, in which the operational member further has a conductor layer that is partly deformable corresponding to the input operation to a plurality of the key areas against the electrode substrate.

(7) The input apparatus according to (2) above, further including:

a control unit electrically connected to the electrode substrate, and being capable of generating information about the input operation to each of a plurality of the key areas based on outputs from a plurality of the detector sections.

(8) The input apparatus according to (7) above, in which the control unit has a memory storing key layout information about a plurality types of operational members having different layouts of a plurality of the key areas, and an arithmetic unit executing input determination to a predetermined plurality of the key areas based on the key layout information stored in the memory and the outputs from a plurality of detector sections.

(9) The input apparatus according to (8) above, in which the arithmetic unit generates different control signals depending on the amount of the capacitance change in at least one detector section among a plurality of the detector sections.

(10) The input apparatus according to (8) or (9) above, in which the arithmetic unit generates a control signal when the amount of the capacitance change in at least one detector section among a plurality of the detector sections exceeds a predetermined value.

(11) The input apparatus according to any one of (7) to (10) above, in which the control unit is configured such that information about a position of an operational object adjacent to the operational member can be generated based on the capacitance change in a plurality of the first electrode lines and a plurality of the second electrode lines.

(12) The input apparatus according to any one of (1) to (11) above, further including:

a light source capable of emitting an illuminated light to illuminate a plurality of the key areas, and the operational member is composed of a light transmitting material capable of transmitting the illuminated light.

(13) The input apparatus according to (12) above, in which the operational member has a first surface where the input operation is made by the user, a second surface facing to the support, a light guide section formed between the first surface and the second surface and having a side face, and a diffuser section formed on the second surface diffusing the illuminated light to a plurality of the key areas, wherein the light source is disposed on the side face of the base material.

(14) The input apparatus according to (13) above, in which the diffuser section is configured of a concave/convex section formed on the second surface.

(15) The input apparatus according to (13) above, in which the diffuser section is configured of a bonded section of the second surface and a plurality of the structures.

(16) The input apparatus according to (12) above, in which the electrode substrate supports a plurality of the first electrode lines and a plurality of the second electrode lines, and further has a base material composed of a light transmitting material capable of transmitting the illuminated light and having a side face, a plurality of the structures is composed of a light transmitting material capable of transmitting the illuminated light, and the light source is disposed on the side face of the base material.

(17) The input apparatus according to (12) above, in which the electrode substrate supports a plurality of the first electrode lines and a plurality of the second electrode lines, and further has a base material composed of a light transmitting material capable of transmitting the illuminated light, a plurality of the structures is composed of a light transmitting material capable of transmitting the illuminated light, and the light source is composed of a sheet-like light source facing to the operational member via the electrode substrate.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 2, 3, 4, 5 Input apparatus
10, 100 Operational member
10a Key area
14 Conductor layer
20 Electrode substrate
20s Detector section
21 First wiring substrate
22 Second wiring substrate
219 First electrode line
220 Second electrode line
30 Support
320 Structure
321 First concave part
322 Second concave part
323a Through hole
331 First space
332 Second space
40 Sensor sheet
50 Control unit
51 Memory
52 Arithmetic unit
71, 72 Electronic device
100, 101 Light source

The invention claimed is:

1. An input apparatus, comprising:
a deformable sheet-like operational member having a plurality of key areas;
an electrode substrate having a plurality of first electrode lines and a plurality of second electrode lines disposed facing to a plurality of the first electrode lines and crossing with a plurality of the first electrode lines; and
a support having a plurality of structures connecting the electrode substrate and the operational member, first spaces formed between a plurality of the structures corresponding to each of a plurality of the key areas, and second spaces formed between a plurality of the structures common to a predetermined plurality of the key areas, wherein none of the plurality of structures connecting the electrode substrate and the operational member is formed in the second spaces.

2. The input apparatus according to claim 1, wherein
a plurality of detector sections formed at crossing regions of a plurality of the first electrode lines and a plurality of the second electrode lines, and configured such that capacitance is variable depending on a relative distance to a plurality of the key areas, and
a plurality of the structures is disposed on non-crossing regions of a plurality of the first electrode lines and a plurality of the second electrode lines.

3. The input apparatus according to claim 2, wherein
a plurality of the detector sections includes a predetermined plurality of the detector sections capable of detecting an input operation to a predetermined plurality of the key areas, and
a predetermined plurality of the detector sections is disposed on the second spaces such that the number of a predetermined plurality of the detector sections is greater than the number of a predetermined plurality of the key areas.

4. The input apparatus according to claim 2, wherein
a plurality of the detector sections have a predetermined plurality of the detector sections capable of detecting the input operation to a predetermined plurality of the key areas, and
a predetermined plurality of the detector sections is disposed on the second spaces at arrangement pitches different from those of a predetermined plurality of the key areas.

5. The input apparatus according to claim 1, wherein
the support further has a through hole capable of communicating a plurality of the first spaces and a plurality of the second spaces with outside air.

6. The input apparatus according to claim 1, wherein
the operational member further has a conductor layer that is partly deformable corresponding to the input operation to a plurality of the key areas against the electrode substrate.

7. The input apparatus according to claim 2, further comprising:
a control unit electrically connected to the electrode substrate, and being capable of generating information about the input operation to each of a plurality of the key areas based on outputs from a plurality of the detector sections.

8. The input apparatus according to claim 7, wherein
the control unit has
a memory storing key layout information about a plurality of types of operational members having different layouts of a plurality of the key areas, and
an arithmetic unit executing input determination to a predetermined plurality of the key areas based on the key layout information stored in the memory and the outputs from a plurality of detector sections.

9. The input apparatus according to claim 8, wherein
the arithmetic unit generates different control signals depending on the amount of the capacitance change in at least one detector section among a plurality of the detector sections.

10. The input apparatus according to claim 8, wherein
the arithmetic unit generates a control signal when the amount of the capacitance change in at least one detector section among a plurality of the detector sections exceeds a predetermined value.

11. The input apparatus according to claim 7, wherein
the control unit is configured such that information about a position of an operational object adjacent to the operational member can be generated based on the capacitance change in a plurality of the first electrode lines and a plurality of the second electrode lines.

12. The input apparatus according to claim 1, further comprising:
a light source capable of emitting an illuminated light to illuminate a plurality of the key areas, and
the operational member is composed of a light transmitting material capable of transmitting the illuminated light.

13. The input apparatus according to claim 12, wherein
the operational member has
a first surface where the input operation is made by the user,
a second surface facing to the support,
a light guide section formed between the first surface and the second surface and having a side face, and
a diffuser section formed on the second surface diffusing the illuminated light to a plurality of the key areas, wherein the light source is disposed on the side face of the base material.

14. The input apparatus according to claim 13, wherein the diffuser section is configured of a concave/convex section formed on the second surface.

15. The input apparatus according to claim 13, wherein the diffuser section is configured of a bonded section of the second surface and a plurality of the structures.

16. The input apparatus according to claim 12, wherein the electrode substrate supports a plurality of the first electrode lines and a plurality of the second electrode lines, and further has a base material composed of a light transmitting material capable of transmitting the illuminated light and having a side face, a plurality of the structures is composed of a light transmitting material capable of transmitting the illuminated light, and the light source is disposed on the side face of the base material.

17. The input apparatus according to claim 12, wherein the electrode substrate supports a plurality of the first electrode lines and a plurality of the second electrode lines, and further has a base material composed of a light transmitting material capable of transmitting the illuminated light, a plurality of the structures is composed of a light transmitting material capable of transmitting the illuminated light, and the light source is composed of a sheet-like light source facing to the operational member via the electrode substrate.

18. An electronic device, comprising:

a deformable sheet-like operational member having a plurality of key areas;

an electrode substrate having a plurality of first electrode lines and a plurality of second electrode lines disposed facing to a plurality of the first electrode lines and crossing with a plurality of the first electrode lines;

a support having a plurality of structures connecting the electrode substrate and the operational member, first spaces formed between a plurality of the structures corresponding to each of a plurality of the key areas, and second spaces formed between a plurality of the structures common to a predetermined plurality of the key areas, wherein none of the plurality of structures connecting the electrode substrate and the operational member is formed in the second spaces; and a controller having a control unit electrically connected to the electrode substrate, and being capable of generating information about the input operation to each of a plurality of the operational members based on outputs from a plurality of the detector sections.

19. A sensor sheet, comprising:

a first wiring substrate having a plurality of first electrode lines;

a second wiring substrate disposed facing to the first wiring substrate having a plurality of second electrode lines that forms detector sections at crossing regions of a plurality of the first electrode lines and a plurality of the second electrode lines; and a support disposed on the first wiring substrate including
 a plurality of structures disposed on non-crossing regions of a plurality of the first electrode lines and a plurality of the second electrode lines,
 a first concave part formed between a plurality of the structures housing at least one detector section, and
 a second concave part formed between a plurality of the structures housing two or more detector sections, wherein none of the plurality of structures disposed on non-crossing regions of the plurality of the first electrode lines and the plurality of the second electrode lines is formed in the second concave part.

* * * * *